(12) United States Patent
Miki

(10) Patent No.: US 11,710,809 B2
(45) Date of Patent: Jul. 25, 2023

(54) LIGHT-EMITTING DEVICE AND METHOD OF MANUFACTURING THE LIGHT-EMITTING DEVICE

(71) Applicant: NICHIA CORPORATION, Anan (JP)

(72) Inventor: Takahito Miki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 62 days.

(21) Appl. No.: 17/233,079

(22) Filed: Apr. 16, 2021

(65) Prior Publication Data
US 2021/0336098 A1   Oct. 28, 2021

(30) Foreign Application Priority Data

Apr. 24, 2020  (JP) ................................ 2020-077138

(51) Int. Cl.
*H01L 33/50* (2010.01)
*H01L 33/60* (2010.01)
*H01L 33/58* (2010.01)

(52) U.S. Cl.
CPC .......... *H01L 33/504* (2013.01); *H01L 33/505* (2013.01); *H01L 33/58* (2013.01); *H01L 33/60* (2013.01); *H01L 2933/0041* (2013.01); *H01L 2933/0058* (2013.01)

(58) Field of Classification Search
CPC ........... F21V 5/10; H01L 33/505; H01L 33/58
See application file for complete search history.

(56) References Cited

U.S. PATENT DOCUMENTS

| | | | | |
|---|---|---|---|---|
| 7,605,405 B2* | 10/2009 | Harada | .................... | H01L 33/44 257/100 |
| 7,791,274 B2* | 9/2010 | Yano | ........................ | H01L 33/52 362/249.02 |
| 8,723,409 B2* | 5/2014 | Ichikawa | .............. | H01L 33/505 313/501 |
| 9,080,729 B2* | 7/2015 | Jiang | .......................... | F21V 5/04 |
| 2002/0163006 A1* | 11/2002 | Yoganandan | ......... | H01L 33/486 257/E33.059 |

(Continued)

FOREIGN PATENT DOCUMENTS

| | | |
|---|---|---|
| JP | 2009-506557 A | 2/2009 |
| JP | 2013-012516 A | 1/2013 |

(Continued)

*Primary Examiner* — Andrew J Coughlin
(74) *Attorney, Agent, or Firm* — Foley & Lardner LLP

(57) ABSTRACT

A light-emitting device includes a support; a light-emitting element on or above the support; a first wavelength conversion member on or above the light-emitting element, the first wavelength conversion member having an area larger than that of the light-emitting element in a top view; a first light-transmissive member covering a lower surface of an extension region of the first wavelength conversion member an a lateral surface of the light-emitting element; a first light-reflective member on lateral sides of the first wavelength conversion member and the first light-transmissive member; and a second wavelength conversion member disposed on or above the first wavelength conversion member. A thickness of the second wavelength conversion member above a peripheral portion of the first wavelength conversion member is smaller than a thickness of the second wavelength conversion member above a central portion of the first wavelength conversion member.

21 Claims, 14 Drawing Sheets

(56) References Cited

U.S. PATENT DOCUMENTS

| | | | |
|---|---|---|---|
| 2003/0230751 A1* | 12/2003 | Harada | H01L 33/44 |
| | | | 257/E33.072 |
| 2004/0227149 A1* | 11/2004 | Ibbetson | H01L 33/641 |
| | | | 257/E33.059 |
| 2006/0097385 A1* | 5/2006 | Negley | H01L 33/486 |
| | | | 257/722 |
| 2008/0121921 A1* | 5/2008 | Loh | H01L 33/642 |
| | | | 257/676 |
| 2008/0265268 A1 | 10/2008 | Braune et al. | |
| 2009/0261708 A1* | 10/2009 | Moseri | H01L 33/56 |
| | | | 257/E33.061 |
| 2017/0069801 A1 | 3/2017 | Oka et al. | |
| 2018/0130776 A1 | 5/2018 | Oka | |

FOREIGN PATENT DOCUMENTS

| | | |
|---|---|---|
| JP | 2013-179132 A | 9/2013 |
| JP | 2013-197279 A | 9/2013 |
| JP | 2016-072379 A | 5/2016 |
| JP | 2016-072382 A | 5/2016 |
| JP | 2016-092110 A | 5/2016 |
| JP | 2017-054894 A | 3/2017 |
| JP | 2018-078188 A | 5/2018 |

* cited by examiner

LIGHT-EMITTING DEVICE AND METHOD OF MANUFACTURING THE LIGHT-EMITTING DEVICE

CROSS-REFERENCE TO RELATED APPLICATION

This application claims priority to Japanese Patent Application No. 2020-077138, filed on Apr. 24, 2020, the disclosure of which is hereby incorporated by reference in its entirety.

BACKGROUND

The present disclosure relates to a light-emitting device and a method of manufacturing the light-emitting device.

Light-emitting devices that emit light having mixed colors by combinations of light-emitting elements and phosphors are used for, for example, lightings and backlights for liquid-crystal displays.

For example, as disclosed in Japanese Patent Publication No. 2013-179132, such a light-emitting device employs a structure in which a wavelength conversion member is disposed on the light extracting surface of a light-emitting element. Light emitted from the light-emitting element passes through the wavelength conversion member, and a portion of the light is subjected to wavelength conversion before being emitted. For example, white light is observed by a combination of a light-emitting element that emits blue light and a wavelength conversion member that produces yellow light.

However, unevenness in light distribution chromaticity caused by the wavelength conversion member may occur.

SUMMARY

An object of certain embodiments of the present disclosure is to provide a light-emitting device that includes a wavelength conversion member and has reduced unevenness in light distribution chromaticity.

According to one embodiment, a light-emitting device includes: a support; a light-emitting element disposed on or above the support; and a first wavelength conversion member disposed on or above an upper surface of the light-emitting element. The first wavelength conversion member contains a first phosphor. An area of a lower surface of the first wavelength conversion member is larger than an area of the upper surface of the light-emitting element. The first wavelength conversion member has an extension region that, in a top view, extends outward of a periphery of the light-emitting element. The light-emitting device further includes: a first light-transmissive member covering a lower surface of the extension region of the first wavelength conversion member and a lateral surface of the light-emitting element; a first light-reflective member disposed on lateral sides of the first wavelength conversion member and the first light-transmissive member; and a second wavelength conversion member disposed on or above the first wavelength conversion member. The second wavelength conversion member contains a second phosphor. A thickness of the second wavelength conversion member above a peripheral portion of the first wavelength conversion member is smaller than a thickness of the second wavelength conversion member above a central portion of the first wavelength conversion member.

According to another embodiment, a method of manufacturing a light-emitting device includes: disposing a light-emitting element on or above an upper surface of a support; and disposing a first wavelength conversion member on or above an upper surface of the light-emitting element while forming a first light-transmissive member. The first wavelength conversion member contains a first phosphor. In a top view, an area of the first wavelength conversion member is larger than an area of the light-emitting element. The first wavelength conversion member has an extension region that, in a top view, extends outward of a periphery of the light-emitting element. The first light-transmissive member covers a lower surface of the extension region of the first wavelength conversion member and a lateral surface of the light-emitting element. The method further includes: forming a second wavelength conversion member on or above an upper surface of the first wavelength conversion member. The second wavelength conversion member contains a second phosphor. A thickness of the second wavelength conversion member above a peripheral portion of the first wavelength conversion member is smaller than a thickness of the second wavelength conversion member above a central portion of the first wavelength conversion member. The method further includes: forming a first light-reflective member to surround lateral sides of the light-emitting element, the first wavelength conversion member, and the first light-transmissive member.

According to another embodiment, a method of manufacturing a light-emitting device includes: disposing a light-emitting element on or above an upper surface of a support; and disposing a first wavelength conversion member on or above an upper surface of the light-emitting element while forming a first light-transmissive member. The first wavelength conversion member contains a first phosphor. In a top view, an area of the first wavelength conversion member is larger than an area of the light-emitting element. The first wavelength conversion member has an extension region that, in a top view, extends outward of a periphery of the light-emitting element. The first light-transmissive member covers a lower surface of the extension region of the first wavelength conversion member and a lateral surface of the light-emitting element. The method further includes: forming a first light-reflective member to surround lateral sides of the light-emitting element, the first wavelength conversion member, and the first light-transmissive member; forming a frame-shaped second light-reflective member on or above an upper surface of the first light-reflective member; and forming a second wavelength conversion member on or above an upper surface of the first wavelength conversion member. The second wavelength conversion member contains a second phosphor. The second wavelength conversion member is disposed inward of the frame-shaped second light-reflective member. A thickness of the second wavelength conversion member above a peripheral portion of the first wavelength conversion member is smaller than a thickness of the second wavelength conversion member above a central portion of the first wavelength conversion member.

Certain embodiments of the present disclosure can provide a light-emitting device that includes a wavelength conversion member and has reduced unevenness in light distribution chromaticity.

DETAILED DESCRIPTION

Figure 1A:
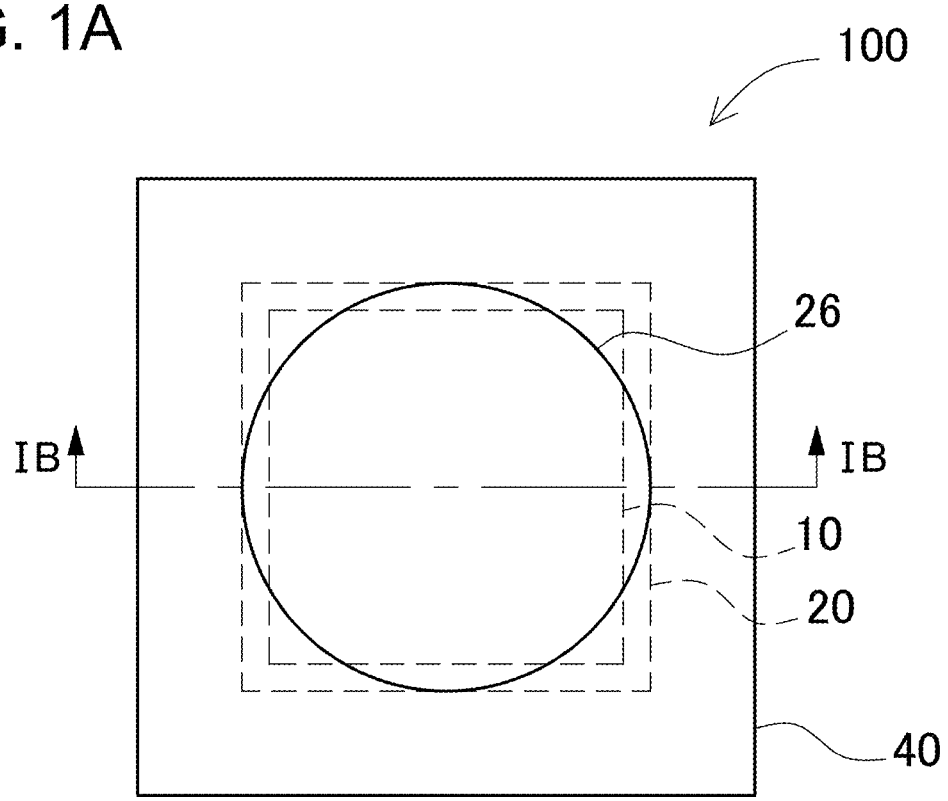
FIG. 1A is a schematic top view of a light-emitting device according to a first embodiment.

According to one embodiment, a light-emitting device includes: a support; a light-emitting element disposed on or above the support; and a first wavelength conversion member disposed on or above an upper surface of the light-emitting element. The first wavelength conversion member contains a first phosphor. An area of a lower surface of the first wavelength conversion member is larger than an area of the upper surface of the light-emitting element. The first wavelength conversion member has an extension region that, in a top view, extends outward of a periphery of the light-emitting element. The light-emitting device further includes: a first light-transmissive member covering a lower surface of the extension region of the first wavelength conversion member and a lateral surface of the light-emitting element; a first light-reflective member disposed on lateral sides of the first wavelength conversion member and the first light-transmissive member; and a second wavelength conversion member disposed on or above the first wavelength conversion member. The second wavelength conversion member contains a second phosphor. A thickness of the second wavelength conversion member above a peripheral portion of the first wavelength conversion member is smaller than a thickness of the second wavelength conversion member above a central portion of the first wavelength conversion member.

According to another embodiment, a method of manufacturing a light-emitting device includes: disposing a light-emitting element on or above an upper surface of a support; and disposing a first wavelength conversion member on or above an upper surface of the light-emitting element while forming a first light-transmissive member. The first wavelength conversion member contains a first phosphor. In a top view, an area of the first wavelength conversion member is larger than an area of the light-emitting element. The first wavelength conversion member has an extension region that, in a top view, extends outward of a periphery of the light-emitting element. The first light-transmissive member covers a lower surface of the extension region of the first wavelength conversion member and a lateral surface of the light-emitting element. The method further includes: forming a second wavelength conversion member on or above an upper surface of the first wavelength conversion member. The second wavelength conversion member contains a second phosphor. A thickness of the second wavelength conversion member above a peripheral portion of the first wavelength conversion member is smaller than a thickness of the second wavelength conversion member above a central portion of the first wavelength conversion member. The method further includes: forming a first light-reflective member to surround lateral sides of the light-emitting element, the first wavelength conversion member, and the first light-transmissive member.

According to another embodiment, a method of manufacturing a light-emitting device includes: disposing a light-emitting element on or above an upper surface of a support; and disposing a first wavelength conversion member on or above an upper surface of the light-emitting element while forming a first light-transmissive member. The first wavelength conversion member contains a first phosphor. In a top view, an area of the first wavelength conversion member is larger than an area of the light-emitting element. The first wavelength conversion member has an extension region that, in a top view, extends outward of a periphery of the light-emitting element. The first light-transmissive member covers a lower surface of the extension region of the first wavelength conversion member and a lateral surface of the light-emitting element. The method further includes: forming a first light-reflective member to surround lateral sides of the light-emitting element, the first wavelength conversion member, and the first light-transmissive member; forming a frame-shaped second light-reflective member on or above an upper surface of the first light-reflective member; and forming a second wavelength conversion member on or above an upper surface of the first wavelength conversion member. The second wavelength conversion member contains a second phosphor. The second wavelength conversion member is disposed inward of the frame-shaped second light-reflective member. A thickness of the second wavelength conversion member above a peripheral portion of the first wavelength conversion member is smaller than a thickness of the second wavelength conversion member above a central portion of the first wavelength conversion member.

With a light-emitting device according to an embodiment of the present disclosure, the total thickness of the first wavelength conversion member and the second wavelength conversion member is set to be large at the central portion of the light-emitting element to increase light subjected to wavelength conversion, while the total thickness of the first wavelength conversion member and the second wavelength conversion member is set to be relatively small in the peripheral region of the light-emitting element to reduce light subjected to wavelength conversion, so that high-quality light emission with reduced unevenness in light distribution chromaticity as a whole can be obtained.

Certain embodiments of the present disclosure can be specified by the structures below.

In a light-emitting device according to an embodiment of the present disclosure, in addition to the above structure, the area of the second wavelength conversion member can be equal to or smaller than the area of the first wavelength conversion member in a top view.

In a light-emitting device according to another embodiment of the present disclosure, in addition to any of the above structures, the light-emitting element can have a rectangular shape in a top view, and the second wavelength conversion member can have a shape of rectangle with rounded corners or a circular shape in a top view.

A light-emitting device according to still another embodiment of the present disclosure can further include, in addition to any of the above structures, a frame-shaped second light-reflective member on or above an upper surface of the first light-reflective member.

The second wavelength conversion member can be disposed inward of the second light-reflective member.

In a light-emitting device according to still another embodiment of the present disclosure, in addition to any of the above structures, the second wavelength conversion member can be disposed in a recess defined by a protrusion on an upper surface of the first light-reflective member.

A light-emitting device according to still another embodiment of the present disclosure can further include, in addition to any of the above structures, a hemispherical second light-transmissive member covering upper surfaces of the second wavelength conversion member and the first light-reflective member.

In a method of manufacturing a light-emitting device having any of the above features according to still another embodiment of the present disclosure, the step of forming a second wavelength conversion member can be performed by potting.

A method of manufacturing a light-emitting device according to still another embodiment of the present disclosure can include, in addition to any of the above features, a step of covering upper surfaces of the second wavelength conversion member and the first light-reflective member with a hemispherical second light-transmissive member.

Certain embodiments and examples of the present disclosure will be described below on the basis of the accompanying drawings. The embodiments and examples below are examples intended to give a concrete form to the technical concept of the present disclosure. However, the present invention is not limited to the embodiments described below. It should be noted that sizes or positional relationships of members illustrated in each drawing may be exaggerated in order to clarify the descriptions. Furthermore, in the descriptions below, the same name or the same reference numeral represents the same member or a member made of the same or a similar material, and its duplicative description will be omitted as appropriate. A portion with the same reference numeral in a plurality of drawings represents the same or equivalent portion or member. As for each element that constitutes the embodiments and examples of the present disclosure, a plurality of elements can be formed of one member so that the member serves as the plurality of elements, or conversely, a combination of a plurality of members can fulfill the function of one member. Some constitutions described in some of the examples or embodiments may be applicable to other examples or embodiments. The descriptions below include terms indicating specific directions or positions (such as "up/upper", "down/lower", "right", "left", and other terms containing these terms) as appropriate. These terms are used to facilitate understanding of the present disclosure referring to the drawings, and the meanings of these terms do not limit the technical scope of the present disclosure. The term "include" and "provide" in the present specification is used to indicate both inclusion or provision as a separate member and inclusion or provision as an integrated member.

First Embodiment

Figure 1B:
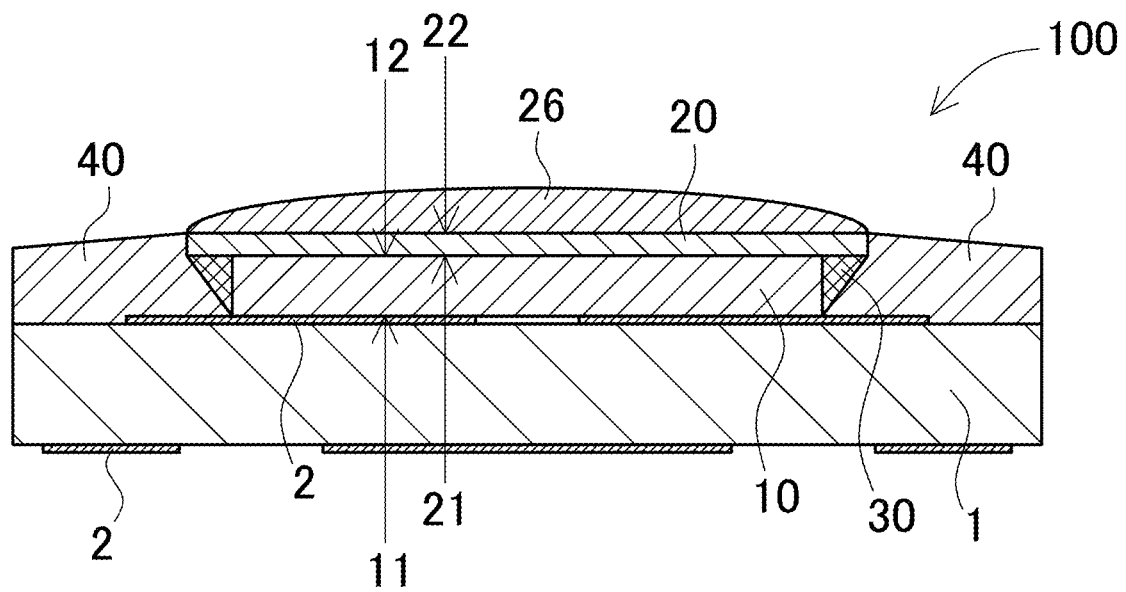
FIG. 1B is a schematic cross-sectional view of the light-emitting device taken along the line IB-IB of FIG. 1A.

A light-emitting device 100 according to a first embodiment will be described with reference to the drawings. FIG. 1A is a schematic top view of the light-emitting device according to the first embodiment. FIG. 1B is a schematic cross-sectional view of the light-emitting device according to the first embodiment taken along the line IB-IB of FIG. 1A.

The light-emitting device 100 according to the first embodiment includes a support 1; a light-emitting element 10 disposed on or above the support 1; a first wavelength conversion member 20 contains a phosphor, wherein the first wavelength conversion member 20 is disposed on or above an upper surface 12 of the light-emitting element 10. An area of a lower surface 21 of the first wavelength conversion member 20 is larger than an area of the upper surface 12 of the light-emitting element 10. In the top view, the first wavelength conversion member 20 has an extension region that extends outward of a periphery of the light-emitting element; a first light-transmissive member 30 continuously covering from a lower surface of the extension region of the first wavelength conversion member 20 to a lateral surface of the light-emitting element 10; a first light-reflective member 40 having a light-reflecting property, wherein the first light-reflective member is disposed on lateral sides of the first wavelength conversion member 20 and the first light-transmissive member 30; and a second wavelength conversion member 26 disposed on or above the first wavelength conversion member 20, and configured to convert light emitted from the light-emitting element 10 into light with a different wavelength. A thickness of the second wavelength conversion member 26 above a peripheral portion of the first wavelength conversion member 20 is smaller than a thickness of the second wavelength conversion member 26 above a central portion of the first wavelength conversion member 20.

With such a structure of the light-emitting device 100 that emits a mixed color of light emitted from the light-emitting element 10 and light subjected to wavelength conversion by the first wavelength conversion member 20 and the second wavelength conversion member 26, the total thickness of the first wavelength conversion member 20 and the second wavelength conversion member 26 is set to be large on the central portion of the light-emitting element 10 to increase light subjected to wavelength conversion while the total thickness of the first wavelength conversion member 20 and the second wavelength conversion member 26 is set to be relatively small in the peripheral region of the light-emitting element 10 to reduce light subjected to wavelength conversion, so that high-quality light emission with reduced unevenness in light distribution chromaticity as a whole can be obtained.

First Wavelength Conversion Member 20

The first wavelength conversion member 20 converts light emitted from the light-emitting element 10 into light with a different wavelength.

The first wavelength conversion member 20 preferably has a rectangular shape in a top view. The first wavelength conversion member 20 can be formed into a plate with a uniform thickness. For example, a YAG phosphor plate, which is a plate material containing a YAG phosphor, can be used.

The first light-reflective member 40 is disposed on the support 1 to surround the first wavelength conversion member 20 and the first light-transmissive member 30.

Figure 2:
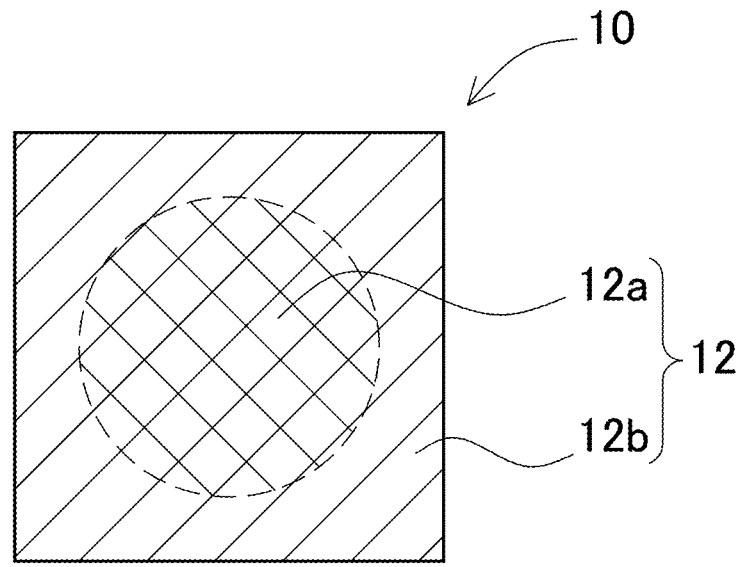
FIG. 2 is a schematic top view illustrating the emission intensity at an emission surface of a light-emitting element.

Generally, as shown in the schematic top view of FIG. 2, the luminance of the light-emitting element 10 tends to be high in a central region 12a (region indicated by cross-hatching in FIG. 2) of the emission surface, which is a second surface 12 of the light-emitting element 10, while low in a peripheral region 12b of the emission surface. Accordingly, in the case in which a wavelength conversion member is disposed on the emission surface of such a light-emitting element 10, the color of the light-emitting element 10 may be relatively noticeable near the center, while the color of the wavelength conversion member may be relatively noticeable in the peripheral portion. This may lead to unevenness in light distribution chromaticity. For example, white light is produced as light of a mixed color by using a blue LED for the light-emitting element and using a YAG phosphor plate for the wavelength conversion member excited by blue light emitted from the blue LED to produce yellow fluorescence. In this light-emitting device, the blue component is relatively strong near the center of the emission surface of the wavelength conversion member, while the yellow component is relatively strong in the peripheral portion of the emission surface of the wavelength conversion member, so that uniform white light may not be obtained.

Figure 3:
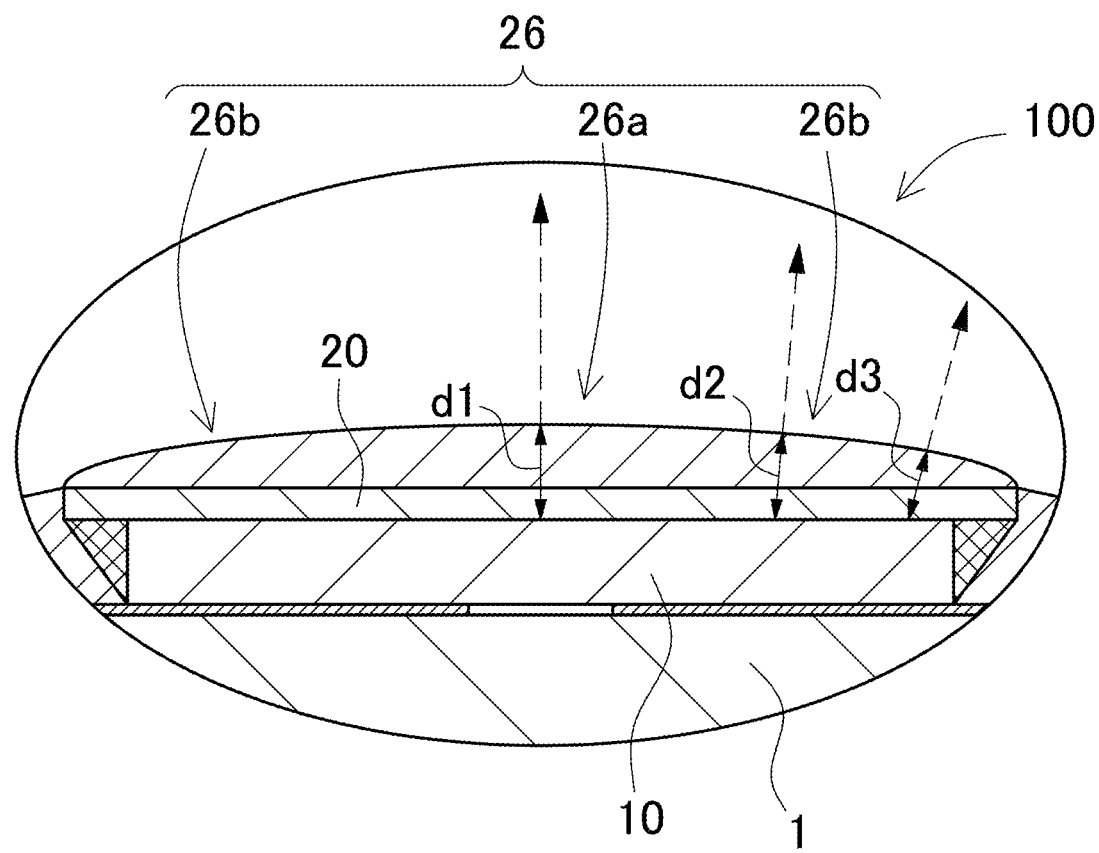
FIG. 3 is a schematic enlarged cross-sectional view illustrating optical path lengths in a wavelength conversion region of the light-emitting device shown in FIG. 1.

On the other hand, in the light-emitting device 100 according to the first embodiment, the thickness of the second wavelength conversion member 26 disposed on the upper surface of the first wavelength conversion member 20 varies so as to be large in a central portion 26a and small in a peripheral portion 26b while the first wavelength conversion member 20 has a uniform thickness as shown in the schematic cross-sectional views of FIG. 1B and FIG. 3. With a wavelength conversion region constituted of the first wavelength conversion member 20 having a substantially uniform thickness and the second wavelength conversion member 26 having uneven thickness as described above, the optical path length of light emitted from the light-emitting element 10 travelling through the wavelength conversion region can be easily changed from location to location. That is, the optical path length of light emitted from the light-emitting element 10 travelling through the wavelength conversion region, in other words, the width over which the light is subjected to wavelength conversion, can vary so as to be large in the central portion and become smaller toward the periphery as shown in the schematic cross-sectional view of FIG. 3.

In FIG. 3, a width d1 over which light emitted from the central portion of the light-emitting element 10 is subjected to wavelength conversion by the wavelength conversion region is large, a width d2 over which light is subjected to wavelength conversion by the wavelength conversion region is small in the peripheral region, a width d3 over which light is subjected to wavelength conversion by the wavelength conversion region becomes farther smaller toward the edge. In this structure, intense light from the central portion of the light-emitting element 10 is more likely to be subjected to wavelength conversion by the thick wavelength conversion region, while the wavelength conversion region is thin in the peripheral region where light from the light-emitting element 10 is weak to reduce wavelength conversion of light. Accordingly, light emitted from the light-emitting element 10 and light subjected to wavelength conversion by the first wavelength conversion member 20 are balanced, and the uneven chromaticity in distribution of light emitted from the light-emitting device is reduced, so that more uniform and high-quality light emission can be obtained regardless of the location on the emission surface.

For example, in the combination of a blue LED and a YAG phosphor plate described above, the second wavelength conversion member 26 containing a YAG phosphor is disposed on the upper surface of a YAG phosphor plate serving as the first wavelength conversion member 20, so that chromaticity unevenness in light distribution caused by the noticeability of the blue color in the central portion and the noticeability of the yellow color in the peripheral portion can be reduced, and accordingly more uniform and high-quality white light can be produced.

Second Embodiment

Figure 4:
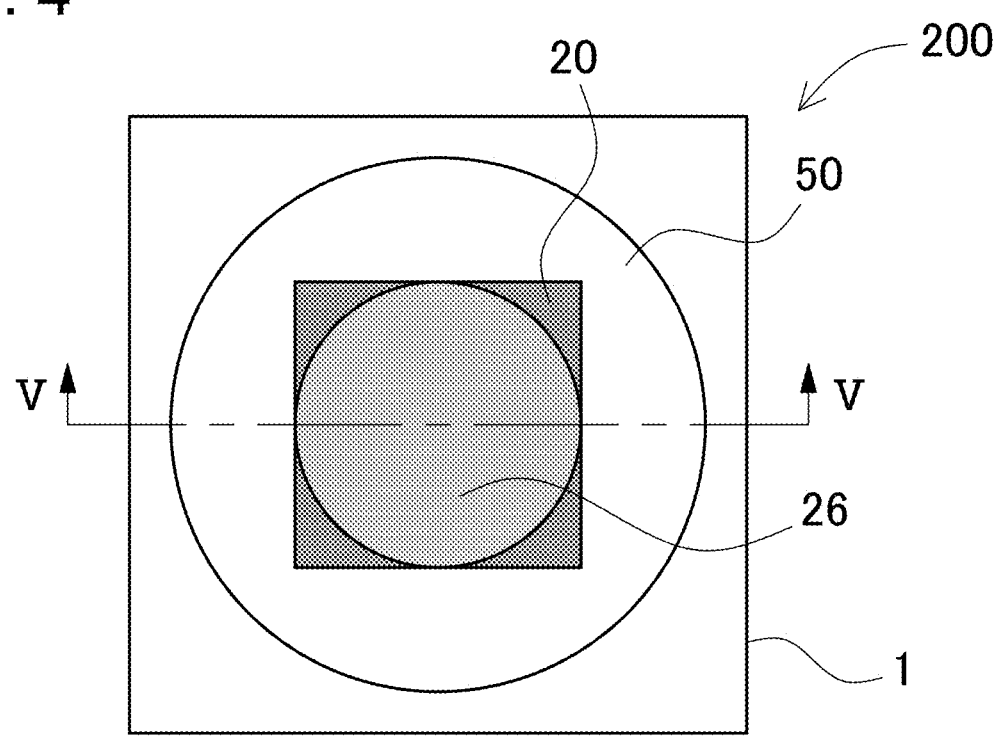
FIG. 4 is a schematic top view of a light-emitting device according to a second embodiment.
Figure 5:
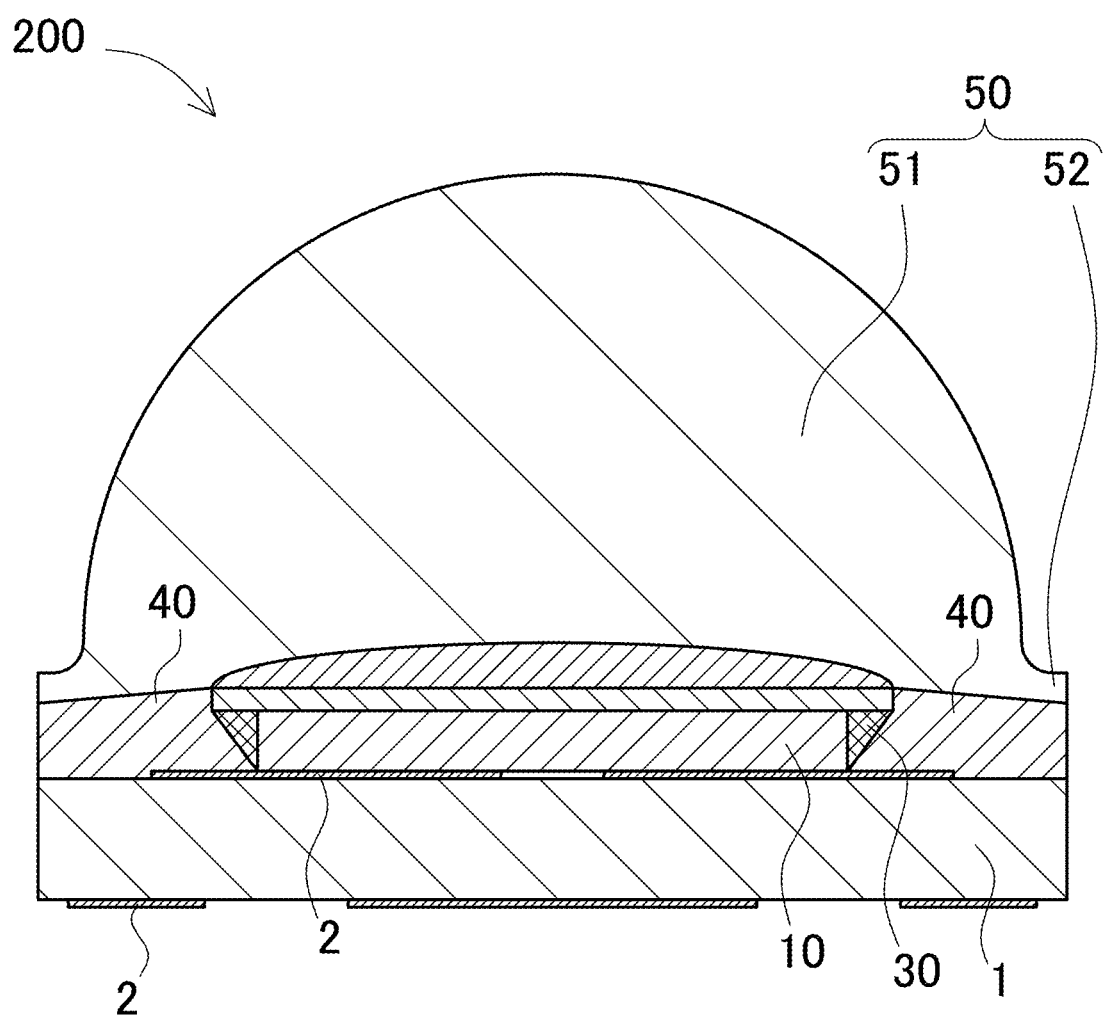
FIG. 5 is a schematic cross-sectional view of the light-emitting device taken along the line V-V of FIG. 4.
Figure 6:
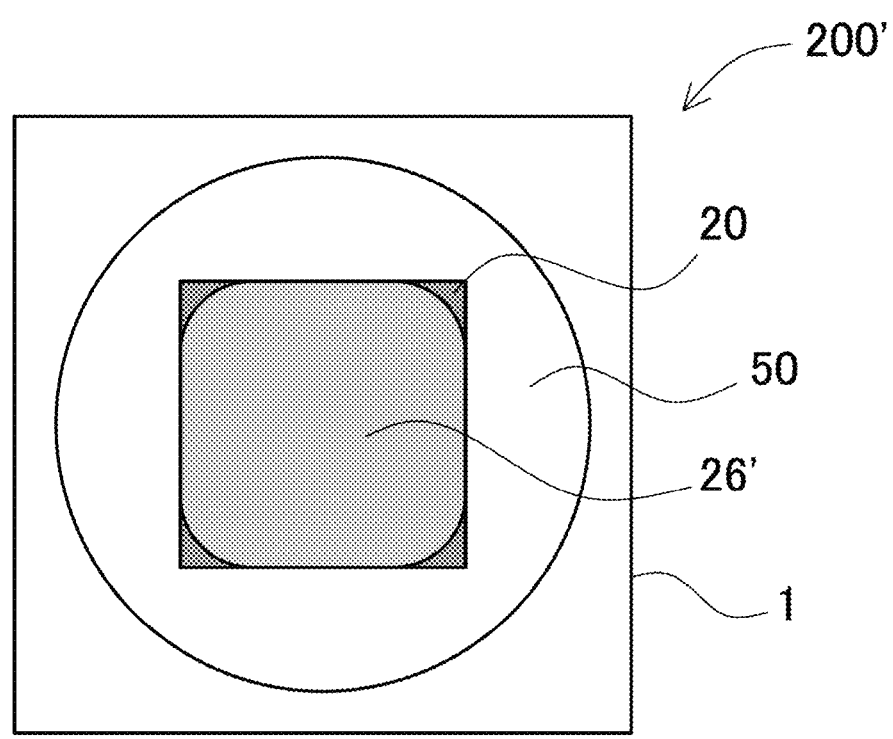
FIG. 6 is a schematic top view of a light-emitting device according to a modification.

A light-emitting device according to a second embodiment is described with reference to the drawings. FIG. 4 is a schematic top view of the light-emitting device according to the second embodiment. FIG. 5 is a schematic cross-sectional view of the light-emitting device according to the second embodiment. Members corresponding to the members in the first embodiment described above are indicated by the same reference numerals, and their detailed descriptions are omitted as appropriate.

A light-emitting device 200 includes the support 1, the light-emitting element 10, the first wavelength conversion member 20, the first light-transmissive member 30, the first light-reflective member 40, the second wavelength conversion member 26, and a hemispherical second light-transmissive member 50 covering the upper surfaces of the second wavelength conversion member 26 and the first light-reflective member 40.

The second light-transmissive member 50 includes a lens portion 51 having a circular shape in a top view and a hemispherical shape in a cross-sectional view and a flange portion 52 extending from the perimeter of the lens portion 51. The lens portion 51 has a circular shape in a top view and a hemispherical shape in a cross-sectional view. The flange portion 52 extends from the perimeter of the lens portion 51. The hemispherical second light-transmissive member 50 is formed into a lens and is of such an optical design as to condense or diffuse light emitted from the light-emitting element 10 according to the shape of the lens. At least one selected from epoxy resins, silicone resins, epoxy-modified silicone resins, and modified silicone resins can be used for a material for the second light-transmissive member 50.

Each member is described in order referring to FIG. 1A to FIG. 7 as appropriate.

Support 1

The support 1 has an upper surface on which the light-emitting element 10, the second light-transmissive member 50, and other components are mounted. The support 1 includes an insulating base material and electrically conductive members 2 such as a wiring pattern, on which the light-emitting element 10 is mounted, on the surface of the base material. Examples of the insulating base material constituting the support 1 include ceramics and resins (including resins such as a glass epoxy resin containing a reinforcing agent). Examples of a ceramic substrate include alumina and aluminum nitride substrates. Examples of the resin include thermosetting resins such as epoxy resins, silicone resins, BT resins, and polyimide resins and thermoplastic resins such as polyphthalamide resins. The base material can have a single-layer structure or a multilayer structure. For example, aluminum nitride can be layered. Aluminum nitride generally has higher thermal conductivity than resin. With aluminum nitride being used for the base material, the heat dissipation performance of the light-emitting device can be improved. A colorant, filling material, or reinforcing agent known in the art can be mixed in these base materials. In particular, a colorant is preferably formed of a material having a good reflectance, and a white material, such as titanium oxide and zinc oxide, is preferable. Examples of the filling material include silica and alumina. Examples of the reinforcing agent include glass, calcium silicate, and potassium titanate.

The electrically conductive members 2 are formed on the upper surface and the lower surface of the support 1 as needed. The electrically conductive members 2 form the wiring pattern to which the light-emitting element 10 is electrically connected. For example, a pair of electrically conductive members 2 are disposed on the back surface of the support 1. Electrodes formed on the light-emitting element 10 are connected to the electrically conductive members 2 of the support 1 by flip-chip bonding or the like with connecting members such as bumps therebetween. Instead of flip-chip mounting the light-emitting element 10 on the support 1, for example, mounting can be performed by wire bonding.

Light-Emitting Element 10

The light-emitting element 10 has a first surface 11 and the second surface 12. The first surface 11 is a mounting surface provided with the electrodes, and the second surface 12 is the light extracting surface opposite to the first surface 11.

An element that emits light in the wavelength range of 380 nm or more and 485 nm or less, which is a short wavelength range in the visible range, can be used for the light-emitting element 10. The peak emission wavelength preferably is in the wavelength range of 400 nm or more and 470 nm or less, more preferably 410 nm or more and 460 nm or less. The phosphor can thus be efficiently excited, and visible light can be effectively used. By using an excitation light source in this wavelength range, a light-emitting device with high emission intensity can be provided.

For example, a semiconductor light-emitting element including a nitride semiconductor with a composition represented by $In_XAl_YGa_{1-X-Y}N$ (where X and Y satisfy $0 \leq X$, $0 \leq Y$, and $X+Y \leq 1$) can be used for the light-emitting element 10. A high-efficiency, stable light-emitting device 100 that has high linearity of output with respect to input and is resistant to mechanical shock can thus be obtained.

The example in which the light-emitting element 10 has a square shape in a top view has been described, but a rectangular shape such as elongated rectangular shapes, a polygonal shape such as hexagonal and octagonal shapes, a circular shape, or an elliptic shape can be employed.

First Wavelength Conversion Member 20

The first wavelength conversion member 20 is disposed on the upper surface of the light-emitting element 10 to convert wavelengths of light emitted from the second surface 12 of the light-emitting element 10 into different wavelengths. For example, in the case in which the light-emitting element 10 emits blue light, this blue light is converted into yellow light, and white light is obtained as a mixture of the blue light and the yellow light. The first wavelength conversion member 20 has a first surface 21 and a second surface 22 opposite to the first surface 21. The first surface 21 of the first wavelength conversion member 20 is larger in area than the second surface 12 of the light-emitting element 10. With this structure, the second surface 12 of the light-emitting element 10, that is, the light extracting surface of the light-emitting element 10, can be entirely covered with the first wavelength conversion member 20, so that unevenness in light distribution can be reduced. In other words, this can reduce chromaticity unevenness in light distribution that would be caused by light (such as blue light) exiting to the outside from the light-emitting element 10 without being subject to color mixture, if a portion of the light extracting surface of the light-emitting element 10 is not covered by the first wavelength conversion member 20.

A ceramic plate material containing a phosphor and an inorganic material, or a resin plate material containing a phosphor and a resin can be used for the first wavelength conversion member 20. The phosphor can be uniformly dispersed or localized in one or more locations. The phosphor is excited by light emitted from the light-emitting element 10 to produce fluorescence with wavelengths longer than the wavelengths of the light emitted from the light-emitting element 10.

A wavelength conversion portion containing a phosphor in the first wavelength conversion member 20 preferably has a thickness of 20 μm or more and 500 μm or less. In the case in which the first wavelength conversion member 20 has a thickness of 500 μm or less, the heat dissipation performance can be improved. In view of the heat dissipation performance, the thinner the first wavelength conversion member 20 is, the more preferable it is. On the other hand, the first wavelength conversion member 20 having a thickness of more than 20 μm can provide a broad chromaticity range of light to be obtained.

The wavelength conversion portion containing a phosphor in the first wavelength conversion member 20 can have a single-layer structure or a multilayer structure. In the case in which the wavelength conversion portion containing a phosphor or the like has a multilayer structure, it is preferable that a first wavelength conversion layer containing a red phosphor be located on the second surface 12 of the light-emitting element 10, and that the second wavelength conversion member 26 containing a yellow phosphor be located on the first wavelength conversion layer. With this structure, the light extraction efficiency of the light-emitting device can be enhanced.

Phosphor

A phosphor that can be excited by light emitted from the light-emitting element 10 is used. Examples of the phosphor include cerium-activated yttrium-aluminum-garnet phosphors, cerium-activated lutetium-aluminum-garnet phosphors, europium-activated silicate phosphors, β-SiAlON phosphors, nitride phosphors, manganese-activated fluoride phosphors, sulfide phosphors, and quantum-dot phosphors. By combining such phosphors and light-emitting elements, light-emitting devices that emit light having various colors can be manufactured.

Second Wavelength Conversion Member 26

The second wavelength conversion member 26 is disposed on the upper surface of the first wavelength conversion member 20. The area of the second wavelength conversion member 26 is preferably equal to or smaller than the area of the first wavelength conversion member 20 in a top view. That is, the second wavelength conversion member 26 is formed inward of the first wavelength conversion member 20 so as not to protrude from the perimeter of the first wavelength conversion member 20. The second wavelength conversion member 26 does not have to be formed on the entirety of the upper surface of the first wavelength conversion member 20, and the second wavelength conversion member 26 may not be disposed on part of the peripheral portion of the first wavelength conversion member 20.

Also, a circular second wavelength conversion member 26 can be inscribed in a rectangular first wavelength conversion member 20 in a top view, instead of disposing the second wavelength conversion member 26 on the corners of the first wavelength conversion member 20. The second wavelength conversion member 26 can be disposed on the corners of the first wavelength conversion member 20 such that the thickness of the second wavelength conversion member 26 on the corners is small.

The second wavelength conversion member 26 is not required to have a perfect circular shape in a top view. For example, a second wavelength conversion member 26' having a shape of a rectangle with rounded corners in a top view can be disposed as in a light-emitting device 200' according to a modification shown in FIG. 6.

The light-emitting element 10 preferably has a rectangular shape in a top view as described above. On the other hand, the second wavelength conversion member 26 preferably has a shape of a rectangle with rounded corners or a circular shape in a top view.

The second wavelength conversion member 26 contains a second phosphor. This phosphor can be the same as or different from a first phosphor contained in the first wavelength conversion member 20. Two or more types of phosphors can be contained in the first wavelength conversion member 20 or the second wavelength conversion member 26. In the first wavelength conversion member 20 or the second wavelength conversion member 26 containing a plurality of phosphors, the phosphors can be dispersed or separated into layers. With such phosphors, light-emitting devices that emit light having various color can be provided.

Rare-earth aluminate phosphors can be suitably used for the phosphors of the first wavelength conversion member 20 and the second wavelength conversion member 26. A rare-earth aluminate phosphor has a composition including at least one element selected from the group consisting of Y, La, Lu, Gd, and Tb, an activator of Ce, Al, and at least one element selected from Ga and Sc as needed. The composition formula is as follows.

$(Y,Lu,Gd,Tb)_3(Al,Ga,Sc)_5O_{12}:Ce$

Another phosphor can be, for example, at least one selected from the group consisting of nitride phosphors, oxynitride phosphors, SiAlON phosphors, alkaline earth haloapatite phosphors, alkaline earth metal boric halide phosphors, alkaline earth metal aluminate phosphors, alkaline earth silicates, alkaline earth sulfides, alkaline earth thiogallates, alkaline earth silicon nitrides, rare-earth aluminates, rare-earth silicates, and organic and organic complexes mainly activated by lanthanoids.

Examples of such phosphors include at least one selected from $(Ca,Sr,Ba)_2SiO_4:Eu, SrGa_2S_4:Eu, (Ca,Sr,Ba)_2Si_5N_8:Eu, CaAlSiN_3:Eu,$ $(Ca,Sr)AlSiN_3:Eu, (Ba,Sr,Ca)_3MgSi_2O_8:Eu, BaMgAl_{10}O_{17}:Eu,$ and $(Ca,Sr)_5(PO_4)_3(F,Cl,Br):Eu.$ A β-SiAlON phosphor has a composition including Si, Al, O, N, and Eu. The composition formula is as follows.

$Si_{6-z}Al_zO_zN_{8-z}:Eu (0<z\leq 4.2)$

A halosilicate phosphor has a composition including Ca, Eu, Mg, Si, O, and at least one halogen selected from the group consisting of F, Cl, and Br. The composition formula is as follows.

$(Ca,Sr,Ba)_8MgSi_4O_{16}(F,Cl,Br)_2:Eu$

A chlorosilicate phosphor having a composition represented by $(Ca,Sr,Ba)_8MgSi_4O_{16}Cl_2:Eu$ is preferable.

A nitride phosphor has a composition including Ca, Eu, Si, Al, N, and Sr as needed. The composition formula is as follows.

$(Sr,Ca)AlSiN_3:Eu$

For example, a KSF phosphor with a peak emission wavelength in the range of 610 nm or more and 650 nm or less and a half width of 10 nm or less can also be used. The composition is represented by the following general formula.

$A_2[M_{1-a}Mn^{4+}_aF_6]$ (In the formula, the symbol "A" is at least one selected from the group consisting of $K^+$, $Li^+$, $Na^+$, $Rb^+$, $Cs^+$, and $NH^{4+}$, M is at least one element selected from the group consisting of the Group IV elements and the Group XIV elements, and "a" satisfies $0<a<0.2$.) For details of the KSF phosphor, Japanese Patent Publication No. 2014-122887, which has been filed by the applicant of the present application, can be referred to.

First Light-Transmissive Member 30

The light-emitting device 100 includes the first light-transmissive member 30 extending from the lateral surfaces of the light-emitting element 10 to the lower surface of the first wavelength conversion member 20. The first light-transmissive member 30 has an outer surface, which is inclined. Back surfaces of the first light-transmissive member 30 are in contact with the light-emitting element 10 and the first wavelength conversion member 20. The first light-transmissive member 30 is located between the lateral surfaces of the light-emitting element 10 and the first light-reflective member 40, and the first light-reflective member 40 serves as a reflector. Accordingly, light emitted from the lateral surfaces of the light-emitting element 10 can be directed toward the front of the light-emitting device, so that the light extraction efficiency of the light-emitting device may be enhanced.

Figure 7:
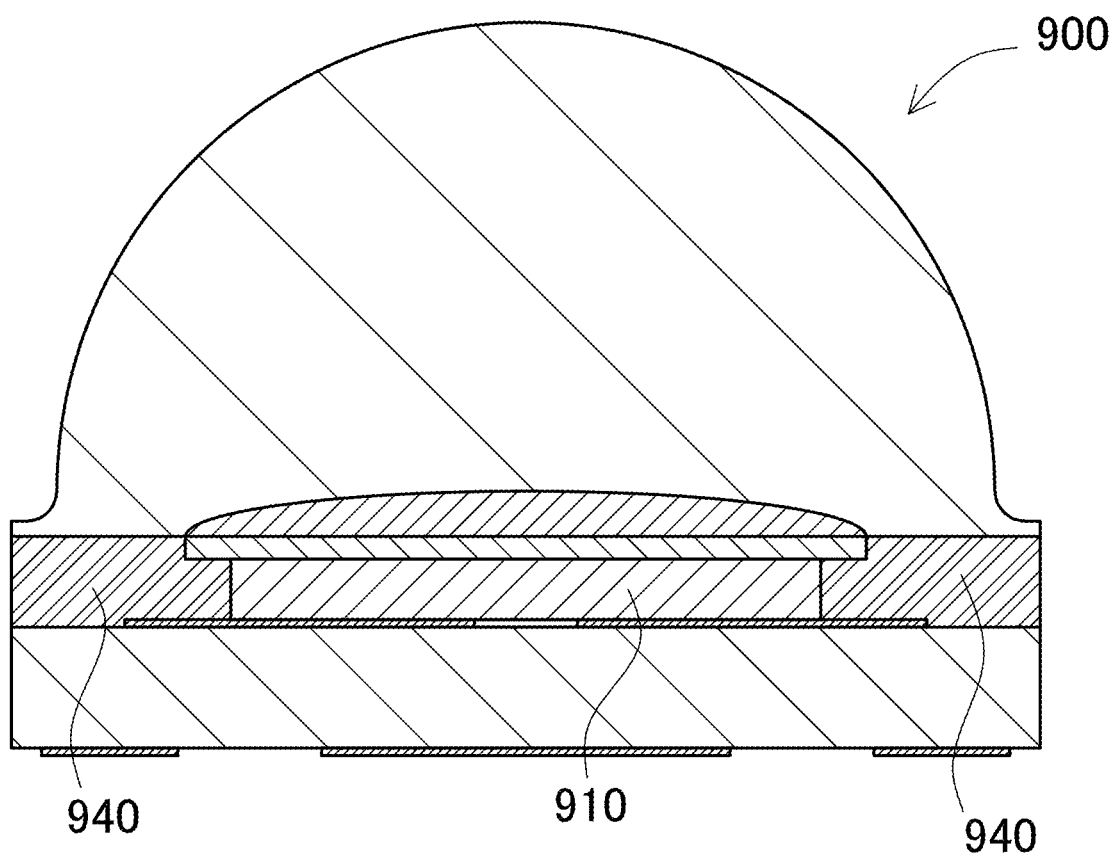
FIG. 7 is a schematic cross-sectional view of a light-emitting device according to a reference example.

In a light-emitting device 900 shown in FIG. 7 as a reference example, lateral surfaces of a light-emitting element 910 are directly covered with a first light-reflective member 940. In this structure, light emitted from the lateral surfaces of the light-emitting element 910 cannot be directly extracted. Accordingly, in the light-emitting device 100 according to the present embodiment, the first light-transmissive member 30 can be located between the lateral surfaces of the light-emitting element 10 and the first light-reflective member 40, and wall surfaces of the first light-reflective member 40 surrounding the light-emitting element 10 can be inclined surfaces broadening toward the direction of emission of light. This structure allows light emitted from the lateral surfaces of the light-emitting element 10 to be reflected at the surface of the first light-reflective member 40 (serving as a reflector) that faces the light-emitting element 10 toward the direction of emission of light, so that the light extraction efficiency can be enhanced.

A space extending from the lateral surfaces of the light-emitting element 10 to the lateral surfaces of the first wavelength conversion member 20 is formed, and the first light-transmissive member 30 is disposed in the space. The first light-transmissive member 30 covers an extension region of the lower surface of the first wavelength conversion member 20 extending from the periphery of the light-emitting element 10 continuously from the lateral surfaces of the light-emitting element 10. The extension region extending from the periphery of the light-emitting element 10 is a portion of the first wavelength conversion member 20. The first light-transmissive member 30 can be constituted of a light-transmissive resin material. A material that is the same as or similar to the material for the second light-transmissive member 50 can be used for the first light-transmissive member 30. For example, at least one selected from silicone resins and epoxy resins is suitably used.

Bonding Member

The first light-transmissive member 30 can include a light-transmissive bonding member between the light-emitting element 10 and the first wavelength conversion member 20. The bonding member can bond the light-emitting element 10 to the first wavelength conversion member 20. The bonding member can partially extend in the corners between the lateral surfaces of the light-emitting element 10 and the main surface of the first wavelength conversion member 20 on the light-emitting element 10. The extending bonding member can have an inverted triangular shape broadening toward the periphery of the bottom surface of the first wavelength conversion member 20 in a cross-sectional view as shown in FIG. 1B. The bonding member can be provided as a different member from the first light-transmissive member 30. For example, the first light-transmissive member 30 is separately formed and bonded between the lateral surfaces of the light-emitting element 10 and the first light-reflective member 40.

A light-transmissive resin can be used for the bonding member. In particular, the bonding member has a higher transmittance with respect to light from the light-emitting element 10 than the transmittance of the first light-reflective member 40. A resin that can bond the first surface 21 of the first wavelength conversion member 20 to the second surface 12 of the light-emitting element 10 described below, such as at least one selected from dimethyl resins, phenyl resins, and diphenyl resins, can be used for the bonding member.

First Light-Reflective Member 40

The first light-reflective member 40 covers the first light-transmissive member 30 and the first wavelength conversion member 20. At least one selected from silicone resins, dimethyl silicone resins, phenyl silicone resins, and epoxy resins can be suitably used for the resin material constituting the first light-reflective member 40. The first light-reflective member 40 is preferably a light-reflective resin having a high reflectance to efficiently reflect light emitted from the light-emitting element 10. For example, a material in which a light-reflective substance is dispersed in a light-transmissive resin can be used. Suitable examples of the light-reflective substance include titanium oxide, silicon oxide, zirconium oxide, potassium titanate, aluminum oxide, aluminum nitride, boron nitride, and mullite. A particle-like, fibrous, or flaky light-reflective substance can be used. A fibrous one can also reduce the thermal expansion coefficient of the first light-reflective member 40 effectively, which is particularly preferable. The first light-reflective member 40 preferably has a reflectance of 70% or more, with respect to light emitted from the light-emitting element 10. Accordingly, light that has reached the first light-reflective member 40 is reflected toward the second surface 22 of the first wavelength conversion member 20, so that the light extraction efficiency of the light-emitting device 100 can be enhanced.

In the present example, a silicone resin containing at least one light-reflective substance selected from $TiO_2$, $SiO_2$, and $Al_2O_3$ is preferably used for the first light-reflective member 40.

The first light-reflective member 40 is preferably in contact with the lateral surfaces of the first wavelength conversion member 20 such that these lateral surfaces are covered. This allows for the light-emitting device 100 with good contrast between a light-emitting region and a non-light-emitting region. The first light-reflective member 40 is preferably located between the first surface 11 of the light-emitting element 10 and the support 1. This structure allows the first light-reflective member 40, which is located between the first surface 11 of the light-emitting element 10 and the support, to reflect light emitted from the light-emitting element 10, so that absorption of the light by the support can be reduced.

Second Light-Transmissive Member 50

The second light-transmissive member 50 is disposed over the upper surface of the second wavelength conversion member 26. The second light-transmissive member 50 includes the lens portion 51 having a circular shape in a top view and a hemispherical shape in a cross-sectional view, and includes the flange portion 52 extending on the perimeter of the lens portion 51. A light-transmissive member can be used for the second light-transmissive member 50. At least one selected from glass, silicone resins, epoxy resins, polycarbonate resins, and acrylic resins can be used for the second light-transmissive member 50. A silicone resin, which has good resistance to light and heat, is particularly suitable. The second light-transmissive member 50 can contain various fillers and the like to diffuse light or adjust the viscosity.

It is preferable that lateral surfaces of the second light-transmissive member 50 and lateral surfaces of the first light-reflective member 40 be in the same plane. Particularly in a structure including the lens portion 51, when the size of the lens is large with respect to the support 1, the light extraction efficiency can be enhanced.

Each of the members described above is not necessarily limited to a combination of disassemblable parts but includes an example in which a material that has been softened in advance is hardened depending on the manufacturing method. That is, it is not necessarily required that disassembly into parts shown in the drawings be possible.

Method of Manufacturing Light-Emitting Device According to Second Embodiment

Figure 8:
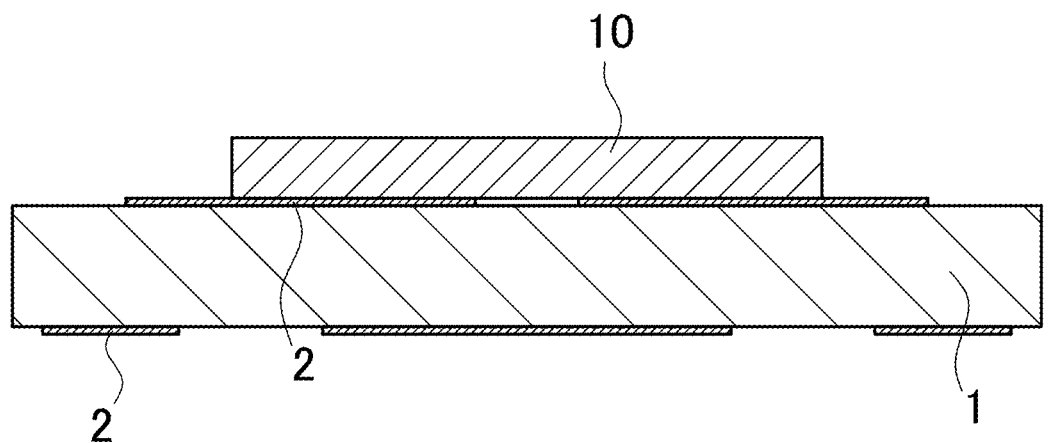
FIG. 8 is a schematic cross-sectional view illustrating part of a method of manufacturing the light-emitting device shown in FIG. 4.

Subsequently, a method of manufacturing the light-emitting device 200 shown in FIG. 4 is described with reference to the schematic cross-sectional views of FIG. 8 to FIG. 12. First, the support 1 is provided, and the light-emitting element 10 having an emission surface is disposed on the upper surface of the support 1 as shown in FIG. 8. In FIG. 8, the light-emitting element 10 is flip-chip mounted on the support 1.

Figure 9:
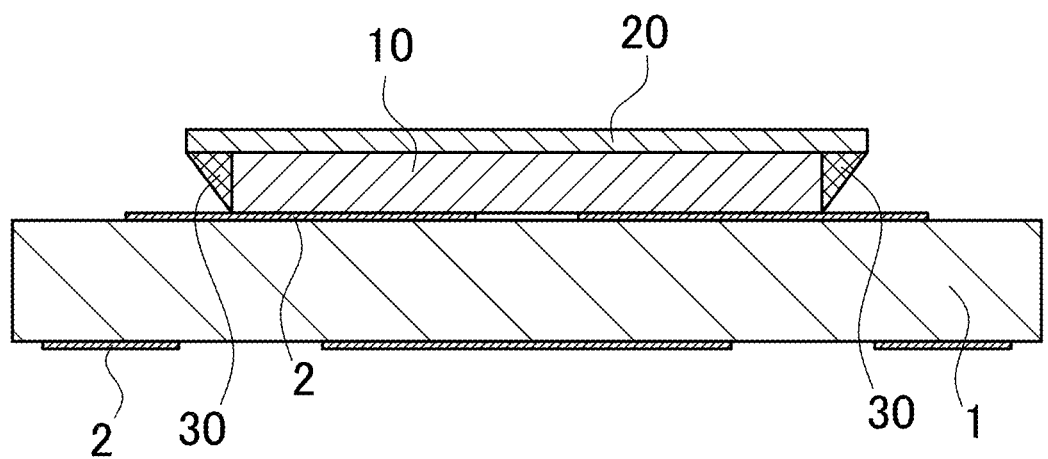
FIG. 9 is a schematic cross-sectional view illustrating part of the method of manufacturing the light-emitting device shown in FIG. 4.

Subsequently, the first wavelength conversion member 20 is disposed on the upper surface of the light-emitting element 10, and the first light-transmissive member 30 is formed as shown in FIG. 9. The first wavelength conversion member 20 is larger in area than the emission surface of the light-emitting element 10 and contains a phosphor. The first wavelength conversion member 20 is bonded to the upper surface of the light-emitting element 10 with a light-transmissive bonding member therebetween. The first light-transmissive member 30 covers the extension region that is part of the lower surface of the first wavelength conversion member 20 and extends from the periphery of the light-emitting element 10, continuously from the lateral surfaces of the light-emitting element 10. The light-transmissive bonding member is applied to the interface between the upper surface of the light-emitting element 10 and the first wavelength conversion member 20. When the first wavelength conversion member 20 is then placed on the upper surface of the light-emitting element 10, the bonding member is squeezed out, adheres to the lateral surfaces of the light-emitting element 10 and the vicinity of the wavelength conversion member 20, and is cured to form a fillet. A material that is the same as or similar to the material for the second light-transmissive member 50 can be used for the light-transmissive bonding member. For example, a silicone resin or an epoxy resin is suitably used. Instead of forming the first light-transmissive member 30 using the bonding member squeezed out, a light-transmissive member separately formed can be provided to the lateral surfaces of the light-emitting element 10. In this way, disposition of the first wavelength conversion member 20 on the upper surface of the light-emitting element 10 and formation of the first light-transmissive member 30 do not necessarily have to be performed at the same time but can be performed in different steps. For example, the first wavelength conversion member 20 can be directly bonded to the upper surface of the light-emitting element 10 without the first light-transmissive member 30. After that, the first light-transmissive member 30 can be formed by applying a material for the first light-transmissive member 30 to the lateral surfaces of the light-emitting element 10 and the lower surface of the first wavelength conversion member 20.

Figure 10:
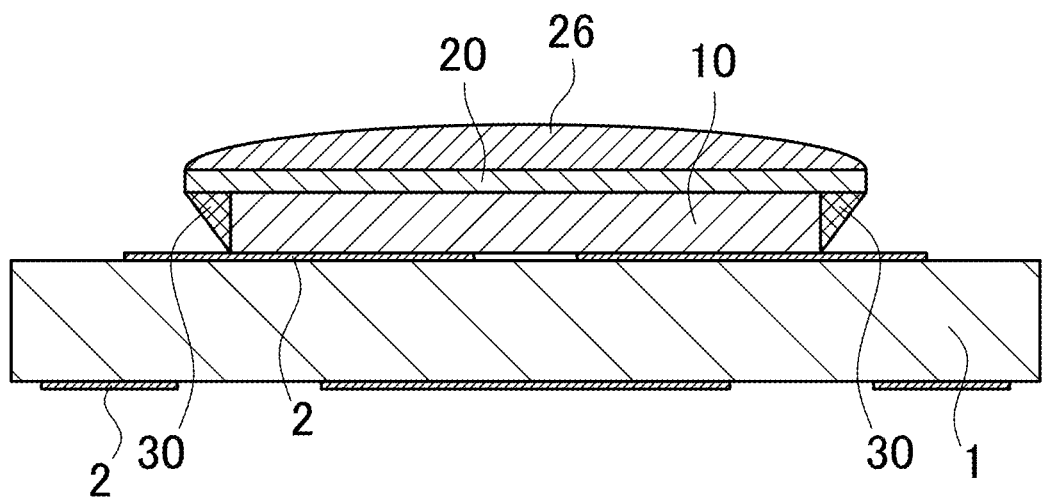
FIG. 10 is a schematic cross-sectional view illustrating part of the method of manufacturing the light-emitting device shown in FIG. 4.

The second wavelength conversion member 26 is then formed on the upper surface of the first wavelength conversion member 20 as shown in FIG. 10. The second wavelength conversion member 26 contains a phosphor. The second wavelength conversion member 26 is formed such that the thickness above the peripheral portion of the first wavelength conversion member 20 is smaller than the thickness above the central portion of the first wavelength conversion member 20. The second wavelength conversion member 26 can be formed by spraying droplets or by potting.

Figure 11:
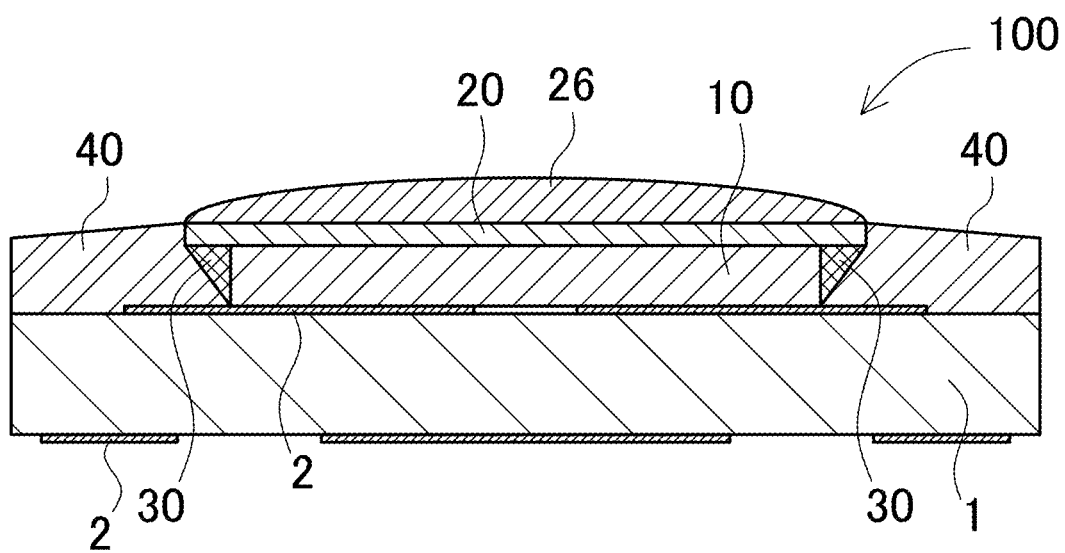
FIG. 11 is a schematic cross-sectional view illustrating part of the method of manufacturing the light-emitting device shown in FIG. 4.

Further, the first light-reflective member 40 is formed to surround lateral sides of the light-emitting element 10, the first wavelength conversion member 20, and the first light-transmissive member 30 as shown in FIG. 11. In the present example, a white resin is disposed on the periphery of the upper surface of the support 1 to cover the lateral surfaces of the wavelength conversion member 20 and the first light-transmissive member 30. The light-emitting device 100 as shown in the schematic cross-sectional view of FIG. 1 is thus obtained.

Figure 12:
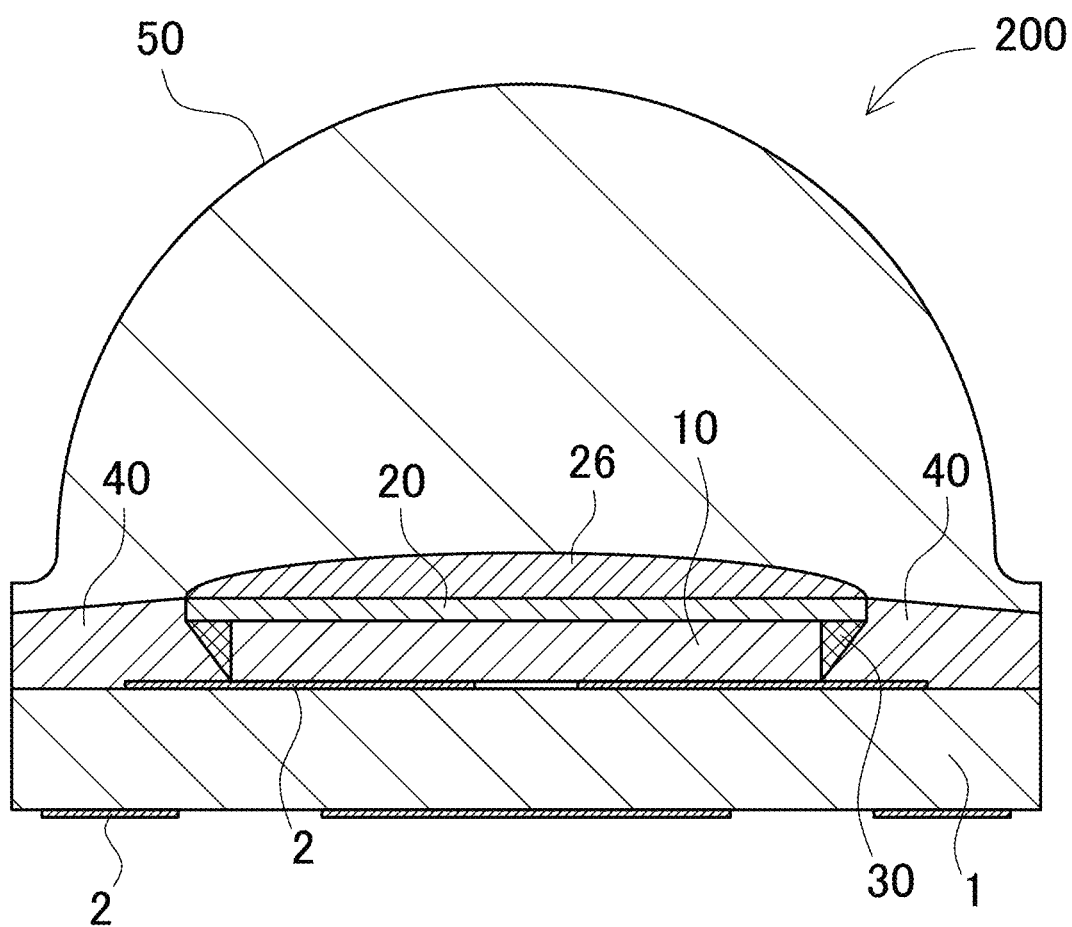
FIG. 12 is a schematic cross-sectional view illustrating part of the method of manufacturing the light-emitting device shown in FIG. 4.

In addition, the upper surfaces of the second wavelength conversion member 26 and the first light-reflective member 40 can be covered with the second light-transmissive member 50. The second light-transmissive member 50 is formed into a hemispherical shape to cover the upper surfaces of the second wavelength conversion member 26 and the first light-reflective member 40 as shown in FIG. 12. The light-emitting device 200 as shown in the schematic cross-sectional view of FIG. 4 is thus obtained.

Third Embodiment

In the example described above, the second wavelength conversion member 26 is directly formed on the upper surface of the first wavelength conversion member 20. The present disclosure is not limited to this structure. A protrusion can be formed on the upper surface of the first light-reflective member 40, and the second wavelength conversion member 26 can be disposed in the region inward of the recess defined by the protrusion.

Figure 13A:
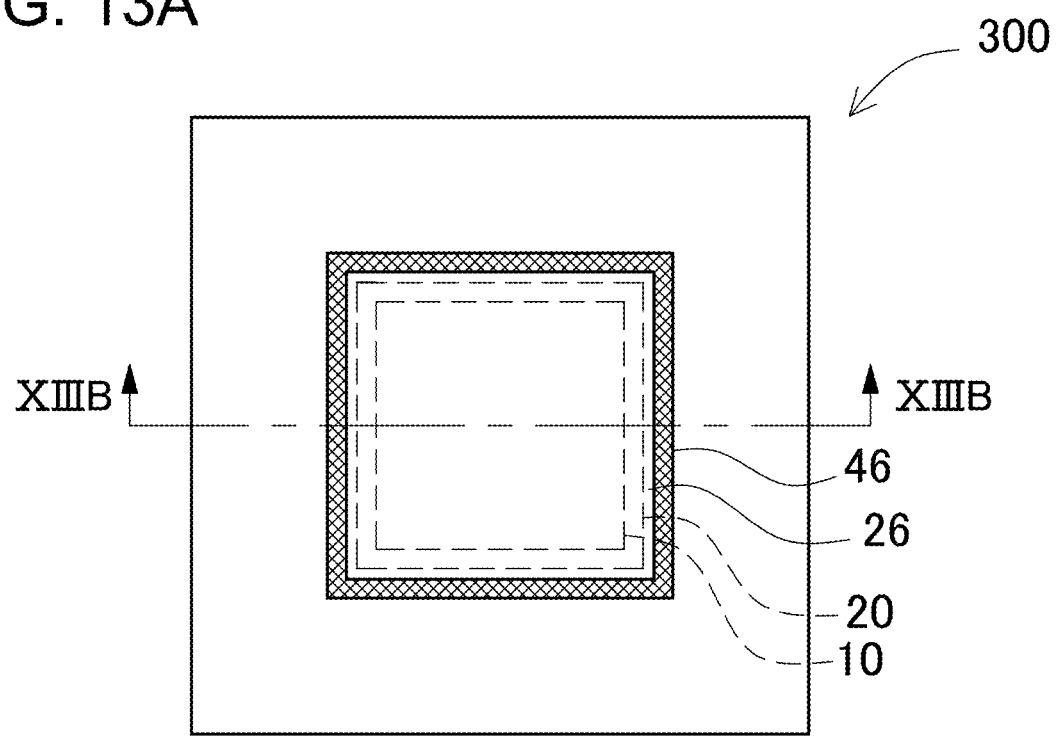
FIG. 13A is a schematic top view of a light-emitting device according to a third embodiment.
Figure 13B:
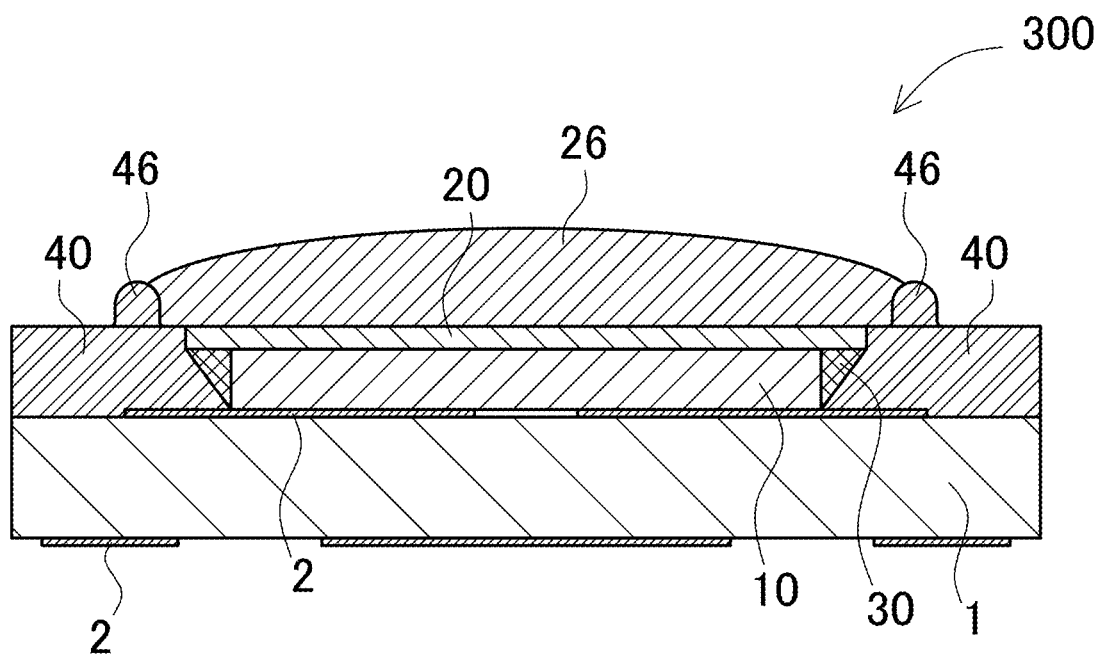
FIG. 13B is a schematic cross-sectional view of the light-emitting device taken along the line XIIIB-XIIIB of FIG. 13A.

Such an example is shown in the schematic cross-sectional view of FIGS. 13A and 13B as a light-emitting device according to a third embodiment. Also in a light-emitting device 300 of FIGS. 13A and 13B, members corresponding to the members in the first and second embodiments described above are indicated by the same reference numerals, and their detailed descriptions are omitted as appropriate. The light-emitting device 300 shown in FIGS. 13A and 13B includes the support 1, the light-emitting element 10 disposed on or above the support 1, the first wavelength conversion member 20 disposed on or above the upper surface of the light-emitting element 10, the first light-transmissive member 30 disposed between the first wavelength conversion member 20 and the light-emitting element 10, the first light-reflective member 40 disposed on the lateral sides of the first wavelength conversion member 20 and the first light-transmissive member 30, a frame-shaped second light-reflective member 46 disposed on or above the upper surface of the first light-reflective member 40, and the second wavelength conversion member 26 disposed on or above the first wavelength conversion member 20.

The frame-shaped second light-reflective member 46 is formed so as to surround the position at which the second wavelength conversion member 26 is to be disposed. The second wavelength conversion member 26 is formed in the region surrounded by the second light-reflective member 46. With such a structure in which the second wavelength conversion member 26 is disposed inward of the second light-reflective member 46, the resin material constituting the second wavelength conversion member 26 does not flow over an unintended portion when the second wavelength conversion member 26 is formed, so that the second wavelength conversion member 26 can be easily formed in a desired shape. The second light-reflective member 46 can be constituted as a member different from the first light-reflective member 40, or can be formed integrally with the first light-reflective member 40.

Fourth Embodiment

The light-emitting device 300 according to the third embodiment can also be provided with the second light-transmissive member 50 such as a lens on the upper surface of the light-emitting device 300. Such a structure is shown in the schematic cross-sectional view of FIGS. 14A and 14B as a light-emitting device 400 according to a fourth embodiment. Also in the light-emitting device 400 of FIGS. 14A and 14B, members corresponding to the members in the embodiments described above are indicated by the same reference numerals, and their detailed descriptions are omitted as appropriate. The light-emitting device 400 shown in FIGS. 14A and 14B includes the support 1, the light-emitting element 10 disposed on or above the support 1, the first wavelength conversion member 20 disposed on or above the upper surface of the light-emitting element 10, the first light-transmissive member 30 disposed between the first wavelength conversion member 20 and the light-emitting element 10 and disposed on the lateral side of the light-emitting element 10, the first light-reflective member 40 disposed on the lateral sides of the first wavelength conversion member 20 and the first light-transmissive member 30, the frame-shaped second light-reflective member 46 disposed on or above the upper surface of the first light-reflective member 40, the second wavelength conversion member 26 on or above the first wavelength conversion member 20, and the hemispherical second light-transmissive member 50 covering upper surfaces of the second wavelength conversion member 26 and the first light-reflective member 40. The hemispherical second light-transmissive member 50 is formed into a lens shape, and is of such an optical design as to condense or diffuse light emitted from the light-emitting element 10 according to the shape of the lens.

Figure 14A:
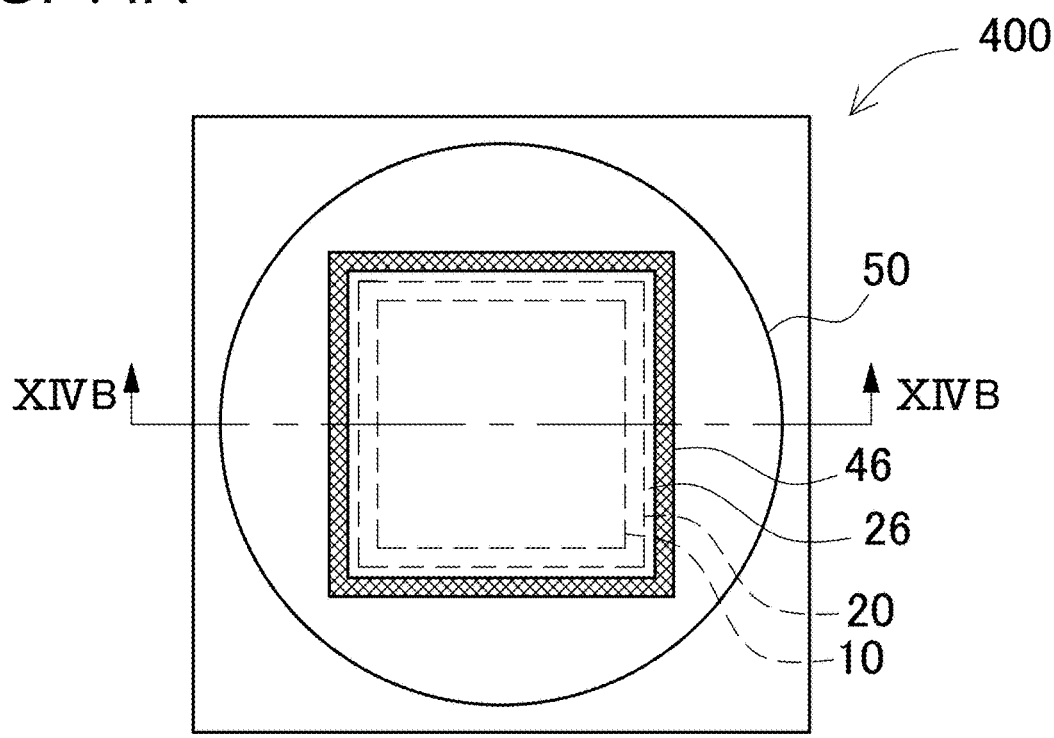
FIG. 14A is a schematic top view of a light-emitting device according to a fourth embodiment.
Figure 14B:
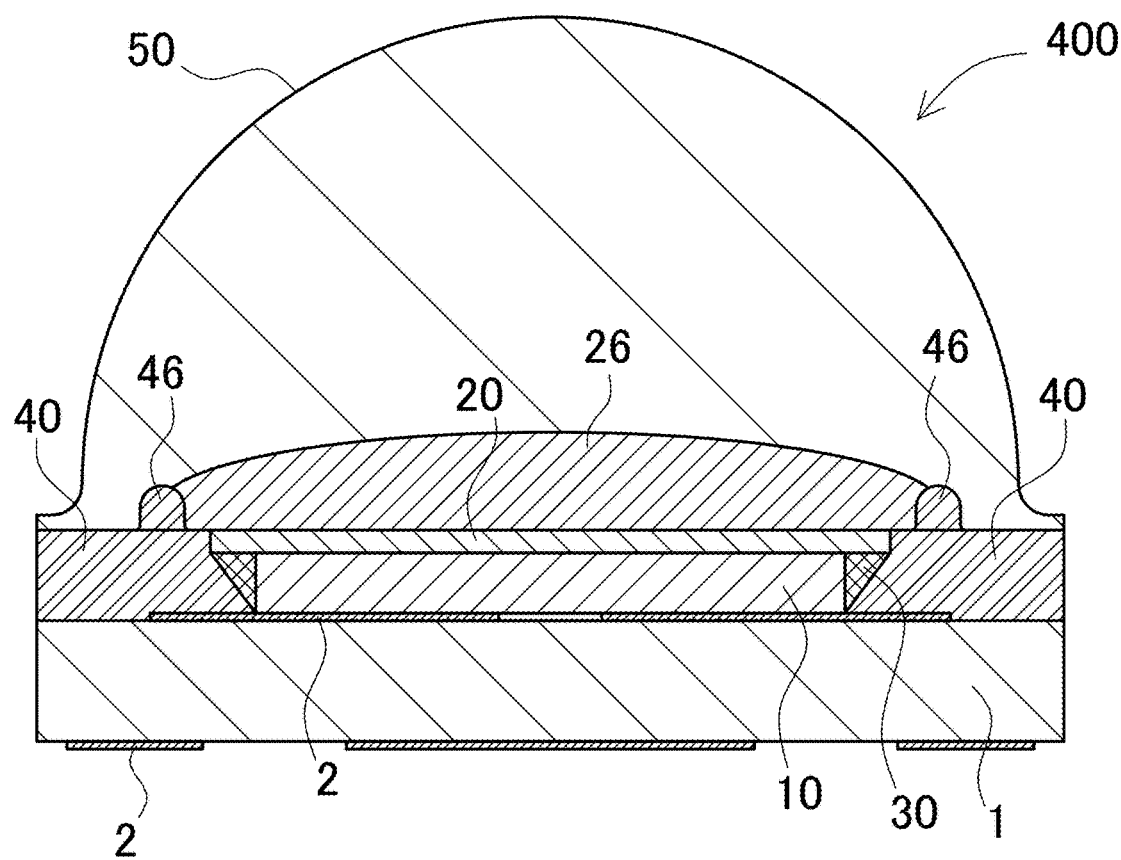
FIG. 14B is a schematic cross-sectional view of the light-emitting device taken along the line XIVB-XIVB of FIG. 14A.
Figure 15:
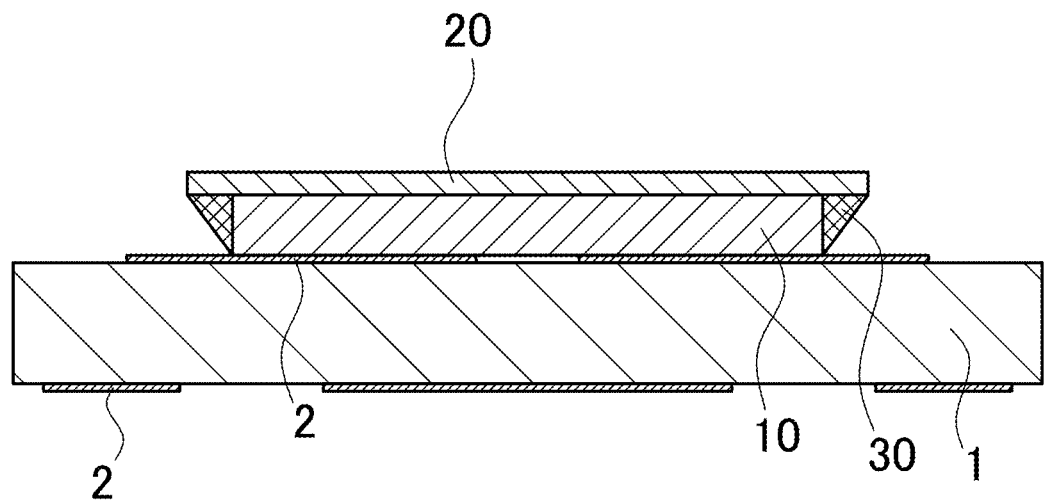
FIG. 15 is a schematic cross-sectional view illustrating part of a method of manufacturing the light-emitting device shown in FIGS. 14A and 14B.

Method of Manufacturing Light-Emitting Device 400 According to Fourth Embodiment Subsequently, a method of manufacturing the light-emitting device 400 shown in FIGS. 14A and 14B is described with reference to the schematic cross-sectional views of FIG. 15 to FIG. 19. The support 1 is provided, and the light-emitting element 10 having the emission surface is disposed on the upper surface of the support 1. Subsequently, the first wavelength conversion member 20 is disposed on the upper surface of the light-emitting element 10, and the first light-transmissive member 30 is formed as shown in FIG. 15. This step can be performed in substantially the same manner as the step shown in FIG. 8 and FIG. 9 described above.

Figure 16:
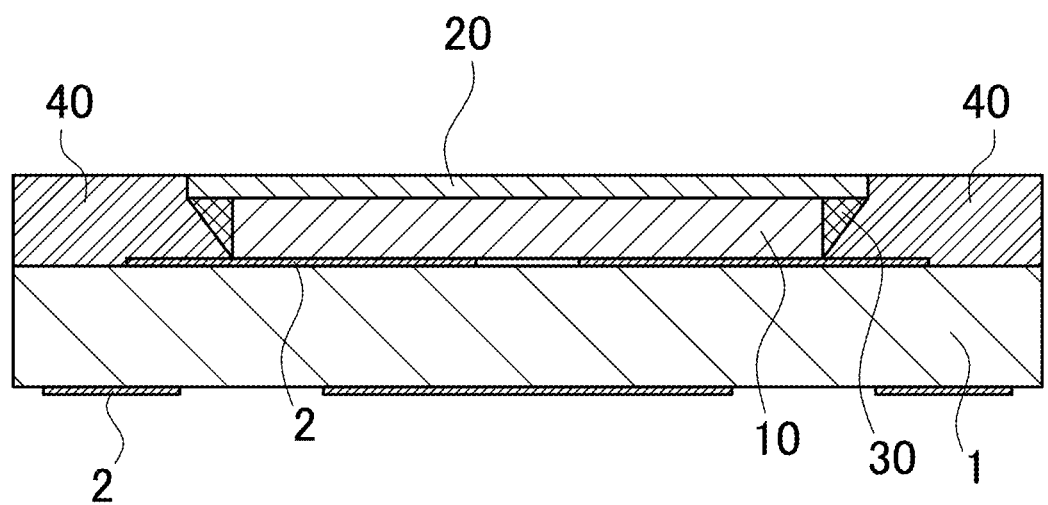
FIG. 16 is a schematic cross-sectional view illustrating part of the method of manufacturing the light-emitting device shown in FIGS. 14A and 14B.

Subsequently, the first light-reflective member 40 is formed to surround lateral sides of the light-emitting element 10, the first wavelength conversion member 20, and the first light-transmissive member 30 as shown in FIG. 16. The first light-reflective member 40 can be formed in substantially the same manner as the step shown in FIG. 11 described above.

Figure 17:
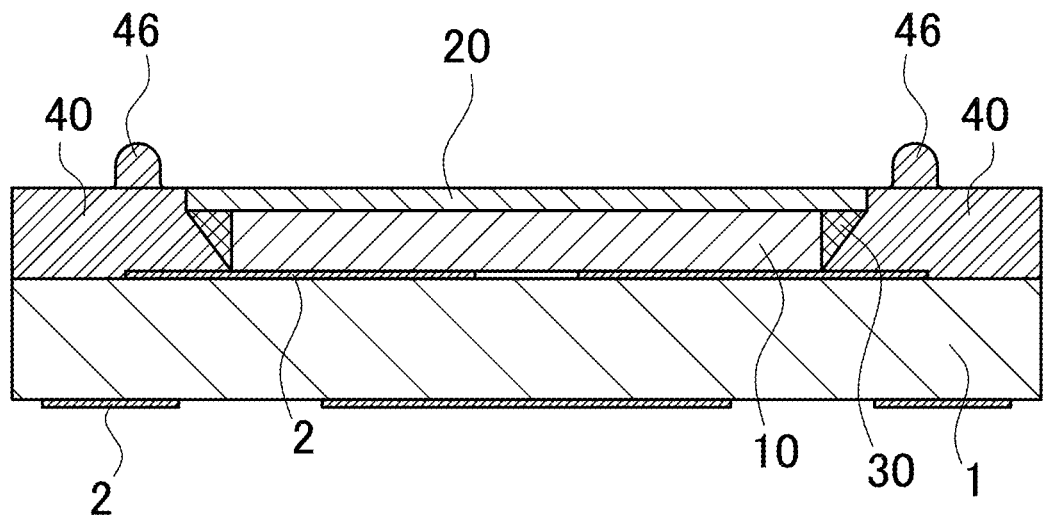
FIG. 17 is a schematic cross-sectional view illustrating part of the method of manufacturing the light-emitting device shown in FIGS. 14A and 14B.

The frame-shaped second light-reflective member 46 is then formed on the upper surface of the first light-reflective member 40. The second light-reflective member 46 is preferably formed away from the perimeter of the first wavelength conversion member 20 so as to have the shape of a frame having an inside diameter larger than the outside diameter of the first wavelength conversion member 20 as shown in FIG. 17. The second light-reflective member 46 is preferably formed of the same material as the first light-reflective member 40 to reduce detachment from the first light-reflective member 40.

Figure 18:
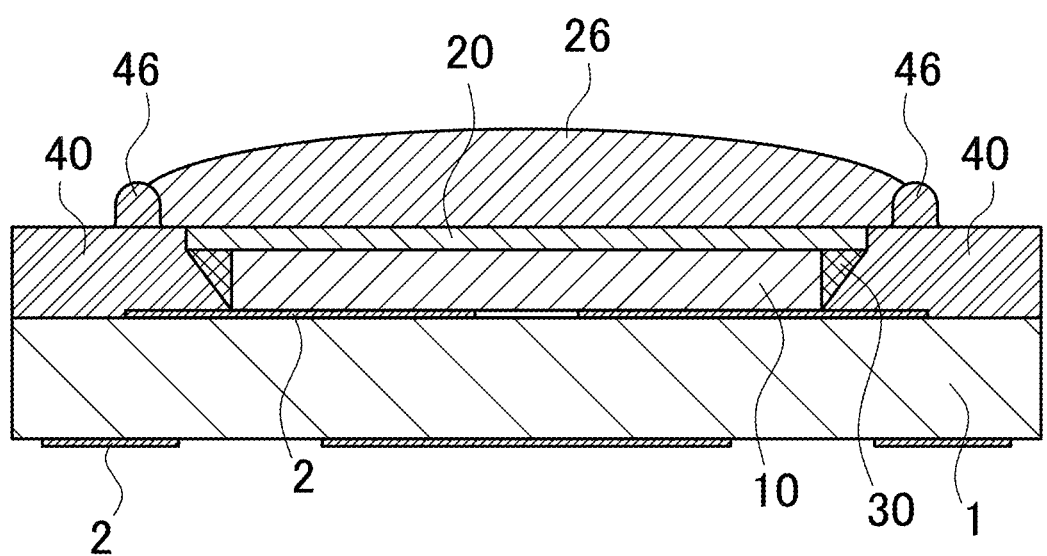
FIG. 18 is a schematic cross-sectional view illustrating part of the method of manufacturing the light-emitting device shown in FIGS. 14A and 14B.

The second wavelength conversion member 26 is then formed inward of the frame-shaped second light-reflective member 46 as shown in FIG. 18. The second light-reflective member 46 contains a phosphor as described above. The second wavelength conversion member 26 is also formed such that the thickness above the peripheral portion of the first wavelength conversion member 20 is smaller than the thickness above the central portion of the first wavelength conversion member 20. The second light-reflective member 46 can also be formed by potting similarly to FIG. 10.

Figure 19:
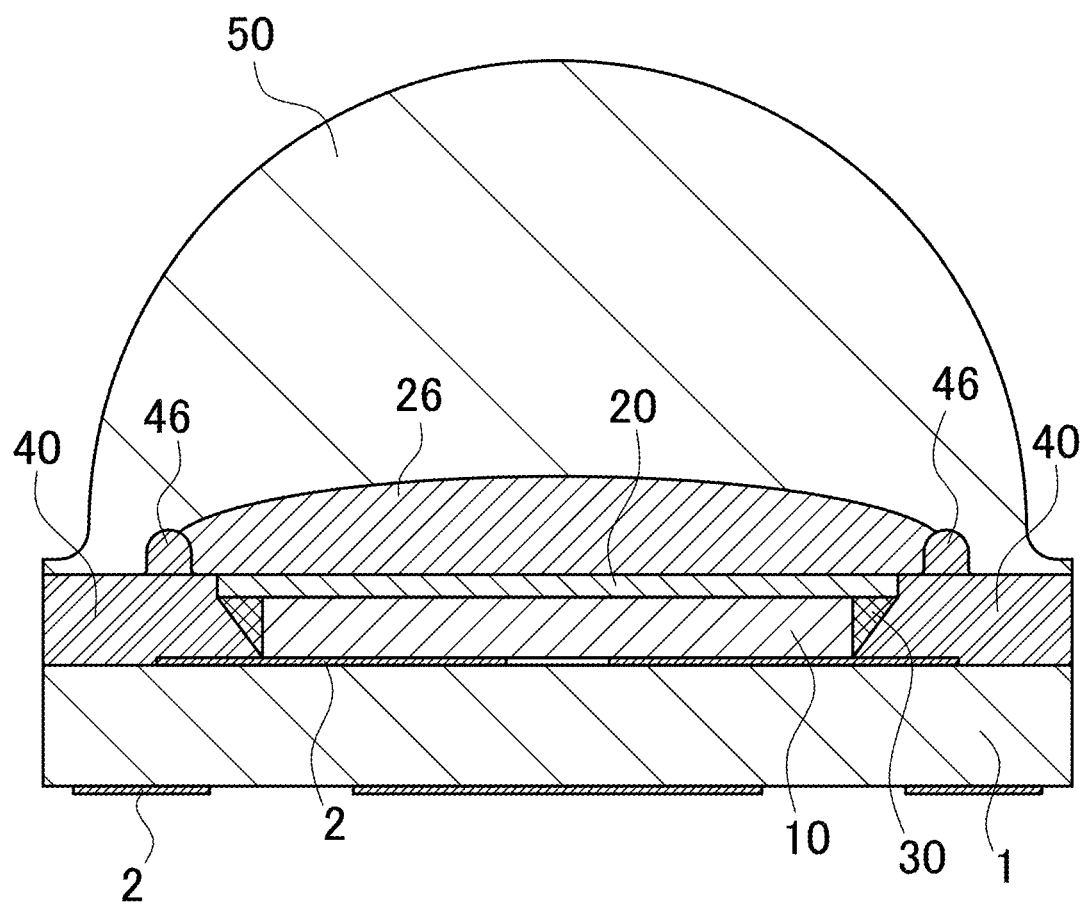
FIG. 19 is a schematic cross-sectional view illustrating part of the method of manufacturing the light-emitting device shown in FIGS. 14A and 14B.

In addition, the upper surfaces of the second wavelength conversion member 26 and the first light-reflective member 40 can be covered with the second light-transmissive member 50 in substantially the same manner. The second light-transmissive member 50 is formed into a hemispherical shape to cover the upper surfaces of the second wavelength conversion member 26 and the first light-reflective member 40 as shown in FIG. 19. The light-emitting device 400 as shown in the schematic cross-sectional view of FIG. 14B is thus obtained.

The light-emitting devices according to the embodiments of the present disclosure can be suitably used for, for example, LED displays, backlight sources for liquid-crystal displays, light sources for lighting, headlights, signals, illuminated switches, various sensors, and various indicators.

It should be apparent to those with an ordinary skill in the art that while various preferred examples of the invention have been shown and described, it is contemplated that the invention is not limited to the particular examples disclosed. Rather, the disclosed examples are merely illustrative of the inventive concepts and should not be interpreted as limiting the scope of the invention. All suitable modifications and changes falling within the spirit of the invention are intended to be encompassed by the appended claims.

What is claimed is:

1. A light-emitting device comprising:
a support;
a light-emitting element disposed on or above the support;
a first wavelength conversion member disposed on or above an upper surface of the light-emitting element, wherein:
the first wavelength conversion member contains a first phosphor,
an area of a lower surface of the first wavelength conversion member is larger than an area of the upper surface of the light-emitting element, and
the first wavelength conversion member has an extension region that, in a top view, extends outward of an outer periphery of the light-emitting element;
a first light-transmissive member covering a lower surface of the extension region of the first wavelength conversion member and a lateral surface of the light-emitting element;
a first light-reflective member disposed on lateral sides a of the first wavelength conversion member and a lateral side of the first light-transmissive member, the first light-reflective member being made of resin material, wherein:
a thickness of the first light-reflective member at an interface with the lateral side of the first wavelength conversion member is larger than a thickness of the first light-reflective member at an outer periphery of the first light-reflective member; and
a second wavelength conversion member disposed on or above the first wavelength conversion member, wherein:
the second wavelength conversion member contains a second phosphor, and
a thickness of the second wavelength conversion member above a peripheral portion of the first wavelength conversion member is smaller than a thickness of the second wavelength conversion member above a central portion of the first wavelength conversion member.

2. The light-emitting device according to claim 1, wherein, in a top view, an area of the second wavelength conversion member is equal to or smaller than an area of the first wavelength conversion member.

3. The light-emitting device according to claim 1, wherein:
in a top view, the light-emitting element has a rectangular shape, and
in a top view, the second wavelength conversion member has a shape of a rectangle with rounded corners, or a circular shape.

4. The light-emitting device according to claim 1, further comprising:
a frame-shaped second light-reflective member disposed on or above an upper surface of the first light-reflective member,
wherein, in a top view, the second wavelength conversion member is disposed inward of the second light-reflective member.

5. The light-emitting device according to claim 1, wherein the second wavelength conversion member is disposed in a recess defined by a protrusion on an upper surface of the first light-reflective member.

6. The light-emitting device according to claim 1, further comprising a hemispherical-shaped second light-transmissive member covering upper surfaces of the second wavelength conversion member and the first light-reflective member.

7. The light-emitting device according to claim 1, wherein the first phosphor and the second phosphor are of the same type.

8. The light-emitting device according to claim 1, wherein the first light-reflective member has an upper surface exposed from the second wavelength conversion member.

9. The light-emitting device according to claim 1, wherein the first light-reflective member has an upper surface inclined downwardly toward the outer periphery of the first light-reflective member.

10. The light-emitting device according to claim 1, further comprising a second light-transmissive member comprising:
a lens portion having a circular shape in a top view and a hemispherical shape in a cross-sectional view, and
a flange portion extending from a perimeter of the lens portion.

11. A method of manufacturing a light-emitting device, the method comprising:
disposing a light-emitting element on or above an upper surface of a support;
disposing a first wavelength conversion member on or above an upper surface of the light-emitting element while forming a first light-transmissive member, wherein:
the first wavelength conversion member contains a first phosphor,
in a top view, an area of the first wavelength conversion member is larger than an area of the light-emitting element,
the first wavelength conversion member has an extension region that, in a top view, extends outward of an outer periphery of the light-emitting element, and
the first light-transmissive member covers a lower surface of the extension region of the first wavelength conversion member and a lateral surface of the light-emitting element;
forming a second wavelength conversion member on or above an upper surface of the first wavelength conversion member, wherein:
the second wavelength conversion member contains a second phosphor, and
a thickness of the second wavelength conversion member above a peripheral portion of the first wavelength conversion member is smaller than a thickness of the second wavelength conversion member above a central portion of the first wavelength conversion member; and
forming a first light-reflective member made of resin material to surround the outer periphery of the light-emitting element, an outer periphery of the first wavelength conversion member, and an outer periphery of the first light-transmissive member, wherein:
a thickness of the first light-reflective member at an interface with the outer periphery of the first wavelength conversion member is larger than a thickness of the first light-reflective member at an outer periphery of the first light-reflective member.

12. The method according to claim 11, wherein the second wavelength conversion member is formed by potting.

13. The method according to claim 11, further comprising disposing a hemispherical second light-transmissive member to cover upper surfaces of the second wavelength conversion member and the first light-reflective member.

14. The method according to claim 11, wherein the first phosphor and the second phosphor are of the same type.

15. A method of manufacturing a light-emitting device, the method comprising:
disposing a light-emitting element on or above an upper surface of a support;
disposing a first wavelength conversion member on or above an upper surface of the light-emitting element while forming a first light-transmissive member, wherein:
the first wavelength conversion member contains a first phosphor,
in a top view, an area of the first wavelength conversion member is larger than an area of the light-emitting element,
the first wavelength conversion member has an extension region that, in a top view, extends outward of an outer periphery of the light-emitting element, and
the first light-transmissive member covers a lower surface of the extension region of the first wavelength conversion member and a lateral surface of the light-emitting element;
forming a first light-reflective member made of resin material to surround the outer periphery of the light-emitting element, an outer periphery of the first wavelength conversion member, and an outer periphery of the first light-transmissive member, wherein:
a thickness of the first light-reflective member at an interface with the outer periphery of the first wavelength conversion member is larger than a thickness of the first light-reflective member at an outer periphery of the first light-reflective member;
forming a frame-shaped second light-reflective member on or above an upper surface of the first light-reflective member; and
forming a second wavelength conversion member on or above an upper surface of the first wavelength conversion member, wherein:
the second wavelength conversion member contains a second phosphor, the second wavelength conversion member is disposed inward of the frame-shaped second light-reflective member, and
a thickness of the second wavelength conversion member above a peripheral portion of the first wavelength conversion member is smaller than a thickness of the second wavelength conversion member above a central portion of the first wavelength conversion member.

16. The method according to claim 15, wherein the first phosphor and the second phosphor are of the same type.

17. The light-emitting device according to claim 10, wherein the flange portion has an upper surface inclined downwardly toward an outer periphery of the flange portion.

18. A light-emitting device comprising:
a support;
a light-emitting element disposed on or above the support;
a first wavelength conversion member disposed on or above an upper surface of the light-emitting element, wherein:
the first wavelength conversion member contains a first phosphor,
an area of a lower surface of the first wavelength conversion member is larger than an area of the upper surface of the light-emitting element, and
the first wavelength conversion member has an extension region that, in a top view, extends outward of an outer periphery of the light-emitting element;
a first light-transmissive member covering a lower surface of the extension region of the first wavelength conversion member and a lateral surface of the light-emitting element;
a first light-reflective member disposed on a lateral side of the first wavelength conversion member and a lateral side of the first light-transmissive member, the first light-reflective member being made of resin material; and
a second wavelength conversion member disposed on or above the first wavelength conversion member, wherein:
the second wavelength conversion member contains a second phosphor, and
a thickness of the second wavelength conversion member above a peripheral portion of the first wavelength conversion member is smaller than a thickness of the second wavelength conversion member above a central portion of the first wavelength conversion member; and
a second light-transmissive member comprising:
a lens portion having a circular shape in a top view and a hemispherical shape in a cross-sectional view, and
a flange portion extending from a perimeter of the lens portion.

19. The light-emitting device according to claim 18, wherein the flange portion has an upper surface inclined downwardly toward an outer periphery of the flange portion.

20. A light-emitting device comprising:
a support;
a light-emitting element disposed on or above the support;
a first wavelength conversion member disposed on or above an upper surface of the light-emitting element, wherein:
the first wavelength conversion member contains a first phosphor,
an area of a lower surface of the first wavelength conversion member is larger than an area of the upper surface of the light-emitting element, and
the first wavelength conversion member has an extension region that, in a top view, extends outward of an outer periphery of the light-emitting element;
a first light-transmissive member covering a lower surface of the extension region of the first wavelength conversion member and a lateral surface of the light-emitting element;
a first light-reflective member disposed on a lateral side of the first wavelength conversion member and a lateral side of the first light-transmissive member, the first light-reflective member being made of resin material; and
a second wavelength conversion member disposed on or above the first wavelength conversion member, wherein:
the second wavelength conversion member contains a second phosphor, and
a thickness of the second wavelength conversion member above a peripheral portion of the first wavelength conversion member is smaller than a thickness of the second wavelength conversion member above a central portion of the first wavelength conversion member; wherein:
the first light-reflective member has an upper surface exposed from the second wavelength conversion member.

21. A light-emitting device comprising:
a support;
a light-emitting element disposed on or above the support;
a first wavelength conversion member disposed on or above an upper surface of the light-emitting element, wherein:
the first wavelength conversion member contains a first phosphor,
an area of a lower surface of the first wavelength conversion member is larger than an area of the upper surface of the light-emitting element, and
the first wavelength conversion member has an extension region that, in a top view, extends outward of an outer periphery of the light-emitting element;
a first light-transmissive member covering a lower surface of the extension region of the first wavelength conversion member and a lateral surface of the light-emitting element;
a first light-reflective member disposed on a lateral side of the first wavelength conversion member and a lateral side of the first light-transmissive member, the first light-reflective member being made of resin material, wherein:
the first light-reflective member has an upper surface inclined downwardly toward an outer periphery of the first light-reflective member; and
a second wavelength conversion member disposed on or above the first wavelength conversion member, wherein:
the second wavelength conversion member contains a second phosphor, and
a thickness of the second wavelength conversion member above a peripheral portion of the first wavelength conversion member is smaller than a thickness of the second wavelength conversion member above a central portion of the first wavelength conversion member.

* * * * *

UNITED STATES PATENT AND TRADEMARK OFFICE
CERTIFICATE OF CORRECTION

PATENT NO. : 11,710,809 B2
APPLICATION NO. : 17/233079
DATED : July 25, 2023
INVENTOR(S) : Takahito Miki Page 1 of 1

It is certified that error appears in the above-identified patent and that said Letters Patent is hereby corrected as shown below:

In the Claims

Claim 1, Column 18, Line 50:
Please delete:
"a first light-reflective member disposed on lateral sides a"
Please replace with:
"a first light-reflective member disposed on a lateral side"

Signed and Sealed this
Twenty-eighth Day of November, 2023

Katherine Kelly Vidal
*Director of the United States Patent and Trademark Office*